(12) United States Patent
Nakabayashi et al.

(10) Patent No.: US 11,264,542 B2
(45) Date of Patent: Mar. 1, 2022

(54) LIGHT-EMITTING DEVICE

(71) Applicant: NICHIA CORPORATION, Anan (JP)

(72) Inventors: Takuya Nakabayashi, Tokushima (JP); Tomokazu Maruyama, Anan (JP); Tetsuya Ishikawa, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 15/965,415

(22) Filed: Apr. 27, 2018

(65) Prior Publication Data

US 2018/0315897 A1    Nov. 1, 2018

(30) Foreign Application Priority Data

Apr. 28, 2017  (JP) .............................. JP2017-089996
May 17, 2017  (JP) .............................. JP2017-098438

(Continued)

(51) Int. Cl.
*H01L 33/00*    (2010.01)
*H01L 33/50*    (2010.01)
(Continued)

(52) U.S. Cl.
CPC .............. *H01L 33/50* (2013.01); *H01L 33/34* (2013.01); *H01L 33/36* (2013.01); *H01L 33/486* (2013.01);
(Continued)

(58) Field of Classification Search
CPC ....... H01L 33/34; H01L 33/36; H01L 33/486; H01L 33/50; H01L 33/56; H01L 33/60; H01L 33/62; H01L 33/44
See application file for complete search history.

(56) References Cited

U.S. PATENT DOCUMENTS

2006/0220205 A1    10/2006  Hongo et al.
2008/0203420 A1*   8/2008  Higaki .................. H01L 33/486
                                                                    257/99
(Continued)

FOREIGN PATENT DOCUMENTS

EP    2674994 A1    12/2013
JP    H02-36074 U    3/1990
(Continued)

OTHER PUBLICATIONS

Non-Final Office Action, United States Patent and Trademark Office, issued to U.S. Appl. No. 17/022,933 dated Dec. 24, 2021, 5 pages.

*Primary Examiner* — Samuel A Gebremariam
(74) *Attorney, Agent, or Firm* — Hunton Andrews Kurth LLP

(57) ABSTRACT

A light-emitting device includes a substrate comprising a base member, a first wiring, a second wiring, and a via hole; at least one light-emitting element electrically connected to and disposed on the first wiring; and a covering member having light reflectivity and covering a lateral surface of the light-emitting element and a front surface of the substrate. The base member defines a plurality of depressed portions separated from the via hole in a front view and opening on a back surface and a bottom surface of the base member. The substrate includes a third wiring covering at least one of inner walls of the plurality of depressed portions and electrically connected to the second wiring. A depth of each of the plurality of depressed portions defined from the back surface toward the front surface is larger on a bottom surface side than on an upper surface side of the base member.

17 Claims, 27 Drawing Sheets

(30) Foreign Application Priority Data

| | | | |
|---|---|---|---|
| Jun. 26, 2017 | (JP) | ............................ | JP2017-123949 |
| Jul. 18, 2017 | (JP) | ............................ | JP2017-138720 |
| Oct. 20, 2017 | (JP) | ............................ | JP2017-203159 |

(51) Int. Cl.

*H01L 33/36* (2010.01)
*H01L 33/56* (2010.01)
*H01L 33/62* (2010.01)
*H01L 33/34* (2010.01)
*H01L 33/60* (2010.01)
*H01L 33/48* (2010.01)

(52) U.S. Cl.
CPC .............. *H01L 33/56* (2013.01); *H01L 33/60* (2013.01); *H01L 33/62* (2013.01)

(56) References Cited

U.S. PATENT DOCUMENTS

| | | |
|---|---|---|
| 2009/0321750 A1 | 12/2009 | Namioka |
| 2010/0207133 A1 | 8/2010 | Taguchi |
| 2011/0051039 A1 | 3/2011 | Okamoto et al. |
| 2013/0020595 A1 | 1/2013 | Moriguchi et al. |
| 2013/0037847 A1* | 2/2013 | Sugiura .................. H01L 33/642 257/99 |
| 2014/0014993 A1 | 1/2014 | Koseki et al. |
| 2015/0064815 A1 | 3/2015 | Harvey et al. |
| 2015/0340578 A1 | 11/2015 | Tamaki et al. |
| 2015/0380622 A1* | 12/2015 | Miyoshi ................ H01L 33/486 257/88 |
| 2017/0062684 A1 | 3/2017 | Ikeda et al. |

FOREIGN PATENT DOCUMENTS

| | | |
|---|---|---|
| JP | 2001257465 A | 9/2001 |
| JP | 2002319710 A | 10/2002 |
| JP | 2002344030 A | 11/2002 |
| JP | 2004281994 A | 10/2004 |
| JP | 2007134602 A | 5/2007 |
| JP | 2009021417 A | 1/2009 |
| JP | 2009164176 A | 7/2009 |
| JP | 2012124191 A | 6/2012 |
| JP | 2013026510 A | 2/2013 |
| JP | 2013041865 A | 2/2013 |
| JP | 2013110210 A | 6/2013 |
| JP | 2014022407 A | 2/2014 |
| JP | 2014033237 A | 2/2014 |
| JP | 2015220426 A | 12/2015 |
| JP | 2017050369 A | 3/2017 |
| WO | 2006/013731 A1 | 2/2006 |

\* cited by examiner

LIGHT-EMITTING DEVICE

CROSS-REFERENCE TO RELATED APPLICATION

This application claims priority to Japanese Patent Application No. 2017-089996 filed on Apr. 28, 2017, No. 2017-098438 filed on May 17, 2017, No. 2017-123949 filed on Jun. 26, 2017, No. 2017-138720 filed on Jul. 18, 2017, No. 2017-203159 filed on Oct. 20, 2017, the disclosures of which are hereby incorporated by reference in their entirety.

BACKGROUND

The present disclosure relates to a light-emitting device.

Light-emitting devices are known in which depressions are formed on the mounting surfaces of supporting members (i.e., base members) and in which the supporting members (i.e., base members) are fixed to mounting boards by supplying brazing filler metals into the depressions (for example, see Japanese Unexamined Patent Application Publication No. 2013-041865).

The present disclosure has an object to provide a light-emitting device in which the mechanical strength of a base member is less likely to be decreased and the bonding strength to a mounting board is improved.

SUMMARY

A light-emitting device according to an embodiment of the present disclosure includes a substrate, at least one light-emitting element, a covering member. The substrate includes a base member having a front surface, a back surface, a bottom surface and an upper surface. The front surface extends in a first direction and a second direction. The first direction is a longitudinal direction and the second is a width direction of the base member. The back surface opposite to the front surface. The bottom surface and the upper surface adjacent and perpendicular to the front surface while being opposed to each other. The substrate includes a first wiring disposed on the front surface and a second wiring disposed on the back surface; and a via hole electrically connecting the first wiring and the second wiring. The at least one light-emitting element is electrically connected to and disposed on the first wiring. The covering member has light reflectivity and covers a lateral surface of the light-emitting element and a front surface of the substrate. The base member defines a plurality of depressed portions that are separated from the via hole in a front view and are open on the back surface and the bottom surface. The substrate includes a third wiring that covers at least one of inner walls of the plurality of depressed portions and electrically connects to the second wiring. A depth of each of the plurality of depressed portions defined from the back surface toward the front surface is larger on a bottom surface side than on an upper surface side of the base member.

In the present disclosure, a light-emitting device with alleviated decrease in the mechanical strength of a base member and improved bonding strength to a mounting board can be provided.

DETAILED DESCRIPTION OF EMBODIMENTS

Figure 1A:
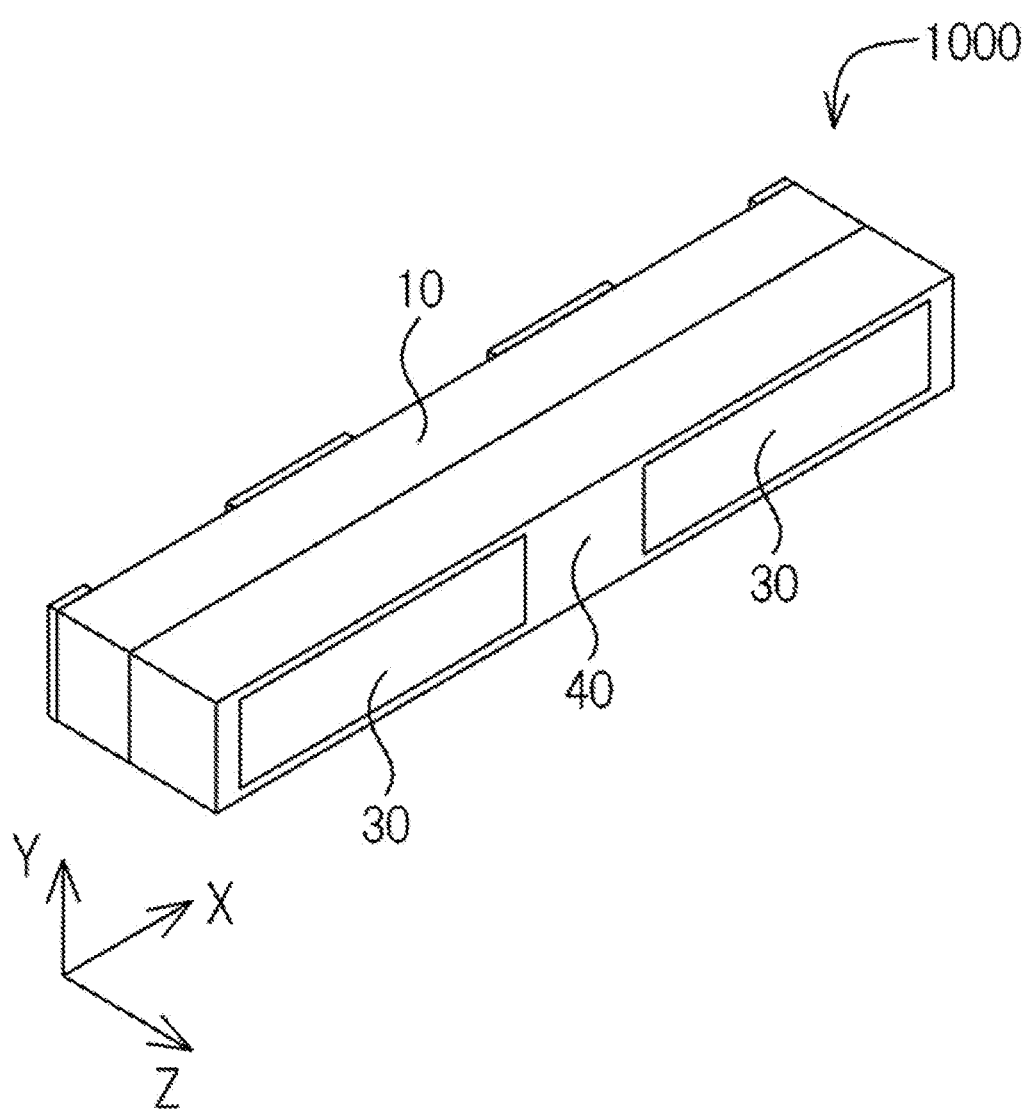
FIG. 1A is a first schematic perspective view of a light-emitting device according to a first embodiment.
Figure 1B:
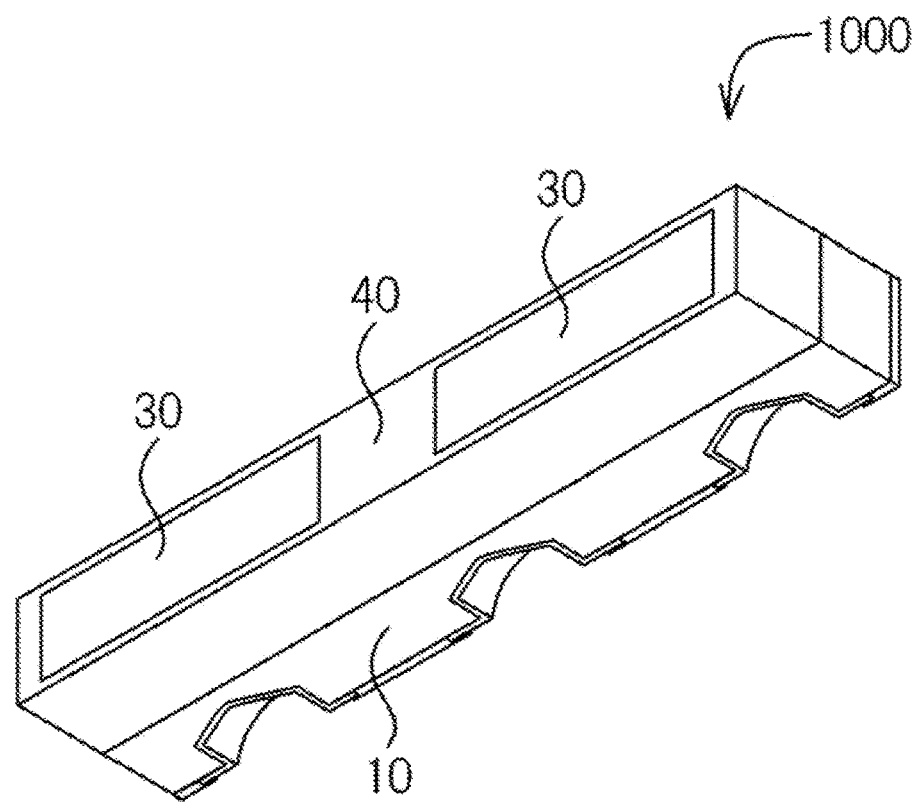
FIG. 1B is a second schematic perspective view of the light-emitting device according to the first embodiment.
Figure 1C:
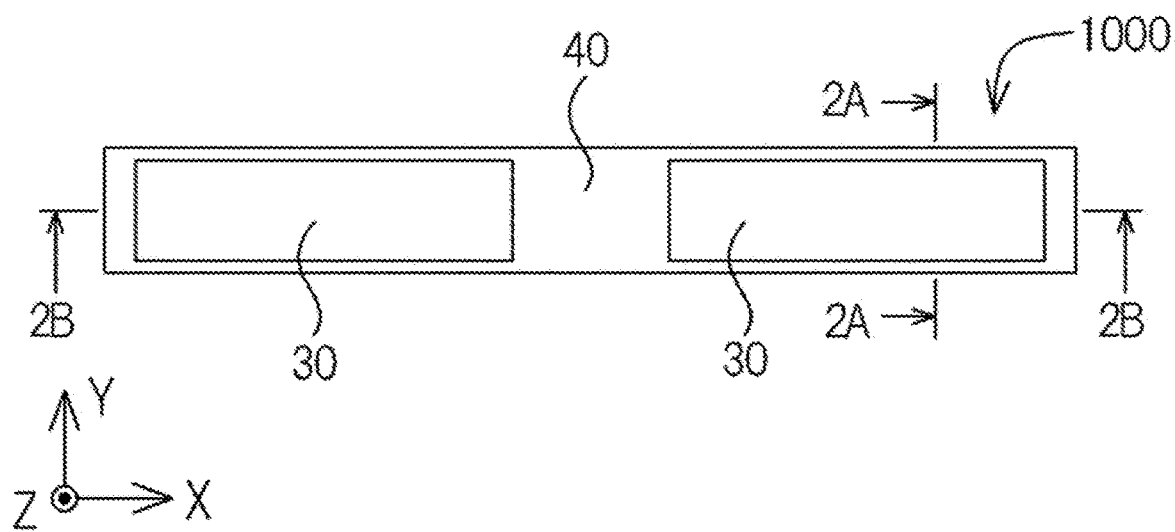
FIG. 1C is a schematic front view of the light-emitting device according to the first embodiment.

The following describes embodiments of the disclosure with reference to the accompanying drawings as appropriate. Light-emitting devices described below are intended to embody the technical concept of the present invention and do not limit the present invention to the devices below unless specifically stated otherwise. It is noted that there is a case where magnitudes or positional relations of members illustrated in the drawings may be exaggerated in order to clarify the descriptions.

First Embodiment

A light-emitting device 1000 according to an embodiment of the present disclosure will be described on the basis of FIG. 1A to FIG. 6. The light-emitting device 1000 includes a substrate 10, one or more light-emitting elements 20, and a covering member 40. The substrate 10 includes a base member 11, first wirings 12, second wirings 13, third wirings 14, and via holes 15. The base member 11 has a front surface 111 extending in a first direction, which is the longitudinal direction, and in a second direction, which is the width direction; a back surface 112 opposite to the front surface; and a bottom surface 113 and an upper surface 114 both adjacent and perpendicular to the front surface 111 while being opposed to each other; and at least one lateral surface positioned between the front surface and the back surface, and between the upper surface and the bottom surface. The base member 11 further includes a plurality of depressed portions 16. The first wirings 12 are disposed on the front surface 111 of the base member 11. The second wirings 13 are disposed on the back surface 112 of the base member 11. The via holes 15 electrically connect the first wirings 12 and the second wirings 13. The light-emitting elements 20 are electrically connected to and disposed on the first wirings 12. The covering member 40 has a light-reflectivity and covers lateral surfaces 202 of the light-emitting elements 20 and the front surface 111 of the substrate. The depressed portions 16 are separated from the via holes 15 in a front view, and open on the back surface 112 and the bottom surface 113. The third wirings 14 cover the inner walls of the depressed portions 16, and are electrically connected to the second wirings 13. Each of the depressed portions 16 has depths W1 and W2 from the back surface 112 toward the front surface 111. The depth W1 which is positioned on the bottom surface side is larger than a depth W2 which is positioned on the upper surface side. The term "perpendicular" in the present specification means 90°±3°.

Figure 2A:
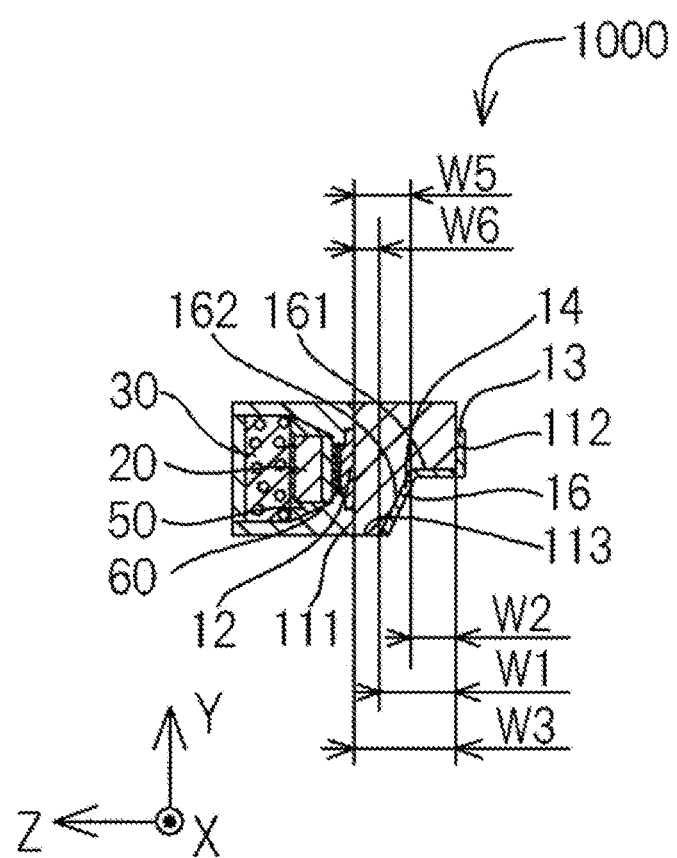
FIG. 2A is a schematic sectional view taken along the line 2A-2A in FIG. 1C.

The light-emitting device 1000 can be fixed to a mounting board with bonding members, such as solder, formed inside the depressed portions 16. The bonding members can be located in the depressed portions, and therefor, the bonding strength between the light-emitting device 1000 and the mounting board can be improved compared with the case where only one depressed portion is formed. As shown in FIG. 2A, the depth of each of the depressed portions from the back surface toward the front surface (in the Z direction) is larger on the bottom surface side than on the upper surface side, thereby allowing a thickness W5 of the base member on the upper surface side of the depressed portion to be larger than a thickness W6 of the base member on the bottom surface side of the depressed portion in the direction (i.e., Z direction) from the back surface toward the front surface. This structure can alleviate decrease in the strength of the base member. Also, making the depth W1 of the depressed portion on the bottom surface side large can increase volume of the bonding member formed inside the depressed portion, thereby improvement of the bonding strength between the light-emitting device 1000 and the mounting board. Increase in the volume of the bonding member can improve the bonding strength to the mounting board in both type of a top view light-emitting device and a side view light-emitting device. The top-view type of light-emitting device is mounted such that the back surface 112 of the base member 11 faces the mounting board. The side-view type of light-emitting device is mounted such that the bottom surface 113 of the base member 11 faces the mounting board. In the present specification, the direction from the back surface toward the front surface is also referred to as the Z direction.

The bonding strength between the light-emitting device 1000 and the mounting board can be improved particularly in the case of the side-view type. The depth of the depressed portions in the Z direction is larger on the bottom surface side than on the upper surface side, the area of the opening of the depressed portion on the bottom surface becomes large. Increase in the area of the opening of the depressed portion on the bottom surface, which faces the mounting board, increases the area of the bonding member located on the bottom surface. This can increase the area of the bonding member located on the surface facing the mounting board, thereby improving the bonding strength between the light-emitting device 1000 and the mounting board.

As shown in FIG. 2A, the depth W1 of the depressed portion 16 in the Z direction is smaller than a thickness W3 of the base member in the Z direction. In other words, the depressed portion 16 does not penetrate through the base member. Forming a hole penetrating through the base member reduces the strength of the base member. Hence, forming the depressed portion that does not penetrate through the base member can alleviate decrease in the strength of the base member. The maximum depth of each of the depressed portions in the Z direction is preferably 0.4 to 0.8 times as large as the thickness of the base member. If the depth of the depressed portion is larger than 0.4 times the thickness of the base member, the volume of the bonding member formed inside the depressed portion increases, thereby improving the bonding strength between the light-emitting device and the mounting board. If the depth of the depressed portion is smaller than 0.8 times the thickness of the base member, decrease in the strength of the base member can be alleviated.

In a sectional view, the depressed portion 16 preferably includes a parallel portion 161 extending from the back surface 112 in the direction (i.e., Z direction) parallel to the bottom surface 113. If the parallel portion 161 is included, the capacity of the depressed portion becomes larger even with the same area of the opening of the depressed portion on the back surface. Increasing the capacity of the depressed portion can increase the amount of the bonding member, such as solder, formed inside the depressed portion, thereby improving the bonding strength between the light-emitting device 1000 and the mounting board. The term "parallel" in the present specification means that tolerance of an inclination of about ±3° is acceptable. In a sectional view, the depressed portion 16 has an inclined portion 162 inclined from the bottom surface 113 toward the direction in which the thickness of the base member 11 increases. The inclined portion 162 may be linear or curved. If the inclined portion 162 is linear, the inclined portion 162 can be readily formed with a drill having a pointed tip. The term "linear" regarding the inclined portion 162 means that a variation such as a curve and a deviation of about 3 µm is acceptable.

Figure 3A:
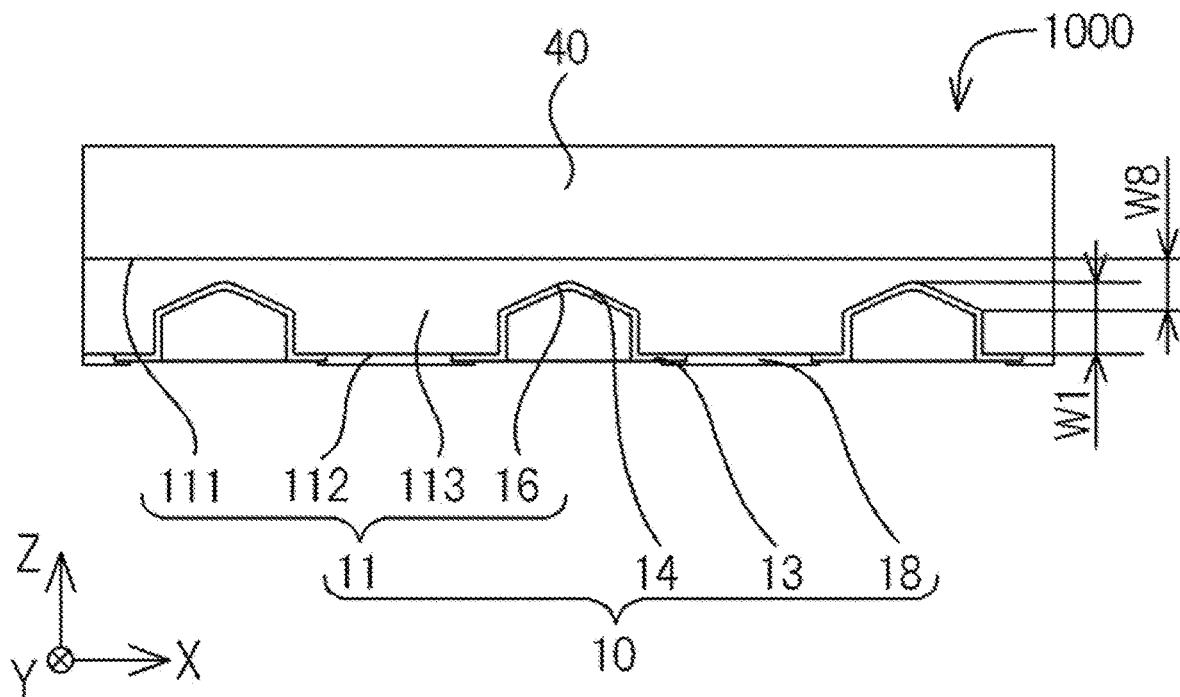
FIG. 3A is a schematic bottom view of the light-emitting device according to the first embodiment.
Figure 3B:
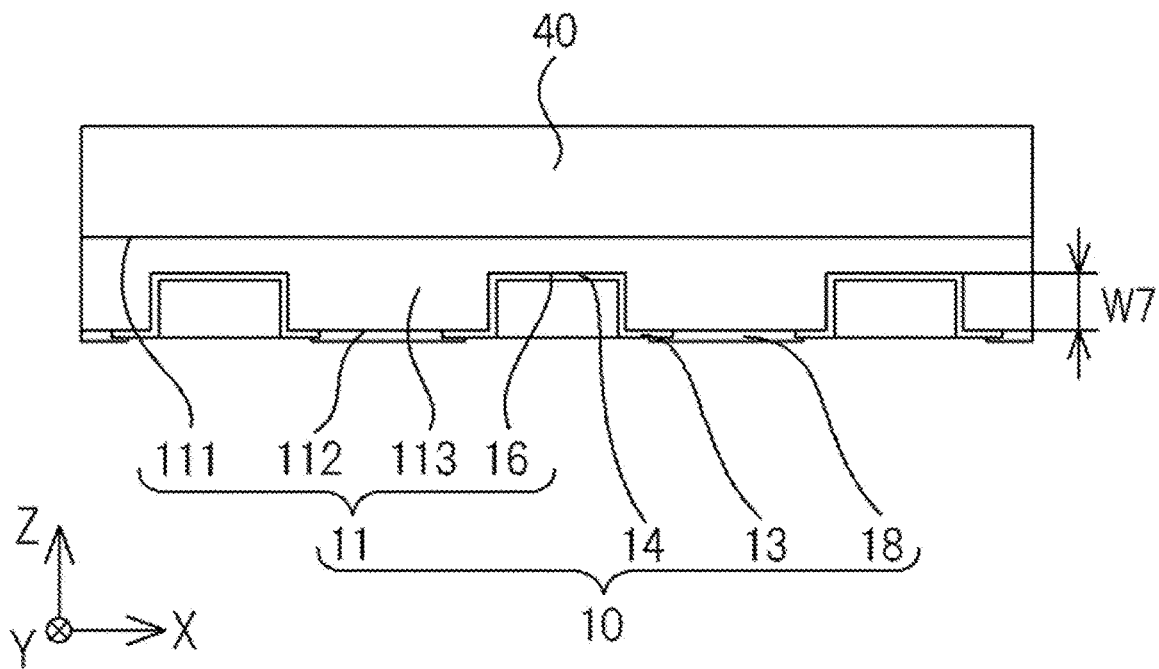
FIG. 3B is a schematic bottom view of a modification of the light-emitting device according to the first embodiment.

On the bottom surface, the depth W1 at the center of each of the depressed portions 16 is preferably the maximum depth of the depressed portion in the Z direction as shown in FIG. 3A. With this structure, the thickness W8 of the base member in the Z direction can be increased at the end of the depressed portion in the X direction on the bottom surface, thereby improving the strength of the base member. The term "center" in the present specification means that a tolerance of about 5 µm is acceptable. A depth W7 of the depressed portion 16 on the bottom surface may be substantially constant in the Z direction as shown in FIG. 3B showing a modification of the first embodiment. In other words, the deepest portion of the depressed portion 16 may be a flat surface. The depressed portion 16 can be formed by a known method, for example, a drill or laser. The depressed portion that has deepest portion at the center on the bottom surface can be easily formed with a drill having a pointed tip. With a drill, a depressed portion having a substantially conical deepest portion and a substantially cylindrical portion continuous with the circle of the bottom surface of the substantially conical shape can also be formed. A depressed portion having a substantially semiconical deepest portion and a substantially semicolumnar portion continuous with the substantial semicircle can be formed by cutting part of the depressed portion by dicing or the like.

Figure 4A:
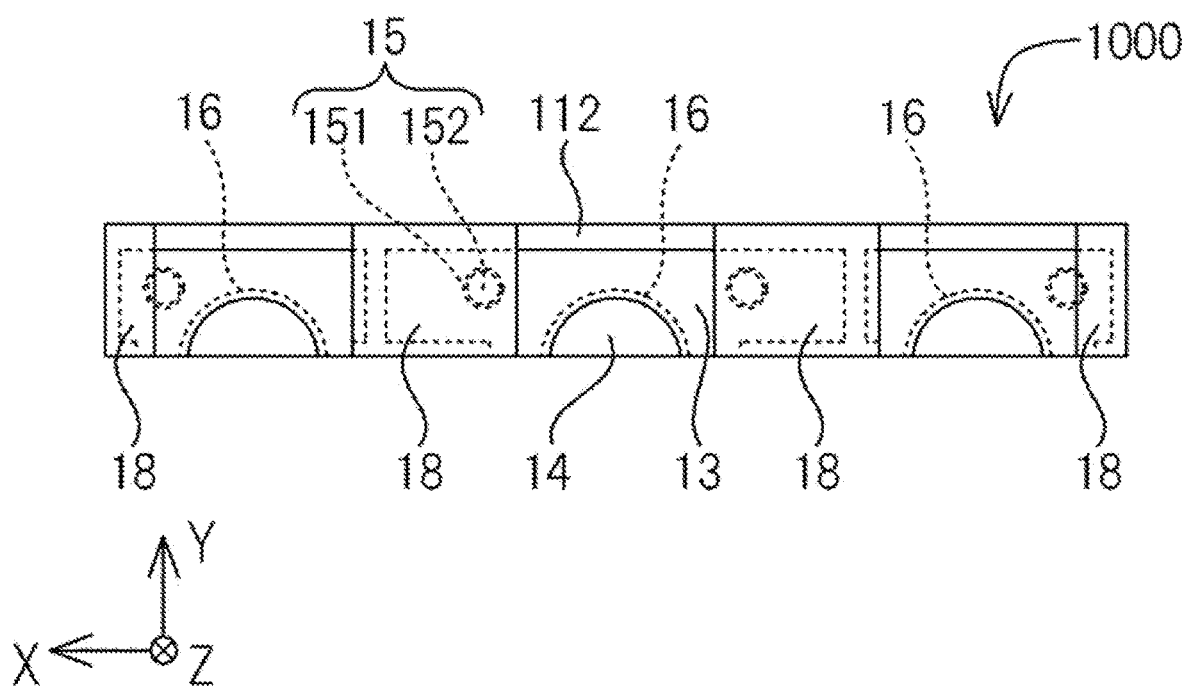
FIG. 4A is a schematic back view of the light-emitting device according to the first embodiment.

The depressed portions 16 preferably have the same shape on the back surface as shown in FIG. 4A. If the depressed portions have the same shape as each other, the depressed portions are more easily formed than in the case where the depressed portions have different shapes. For example, in the case where the depressed portions are formed by drilling, the depressed portions having the same shape as each other can be formed with one drill. The term "same" in the present specification means that a tolerance of about 5 µm is acceptable.

Figure 4B:
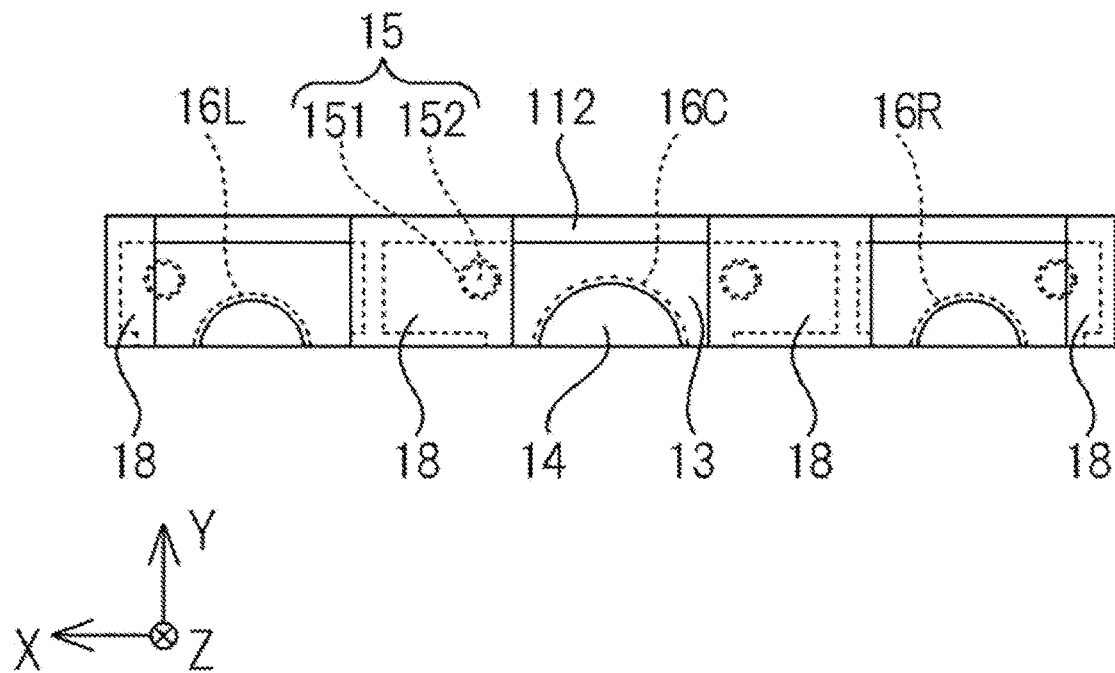
FIG. 4B is a schematic back view of a modification of the light-emitting device according to the first embodiment.
Figure 4C:
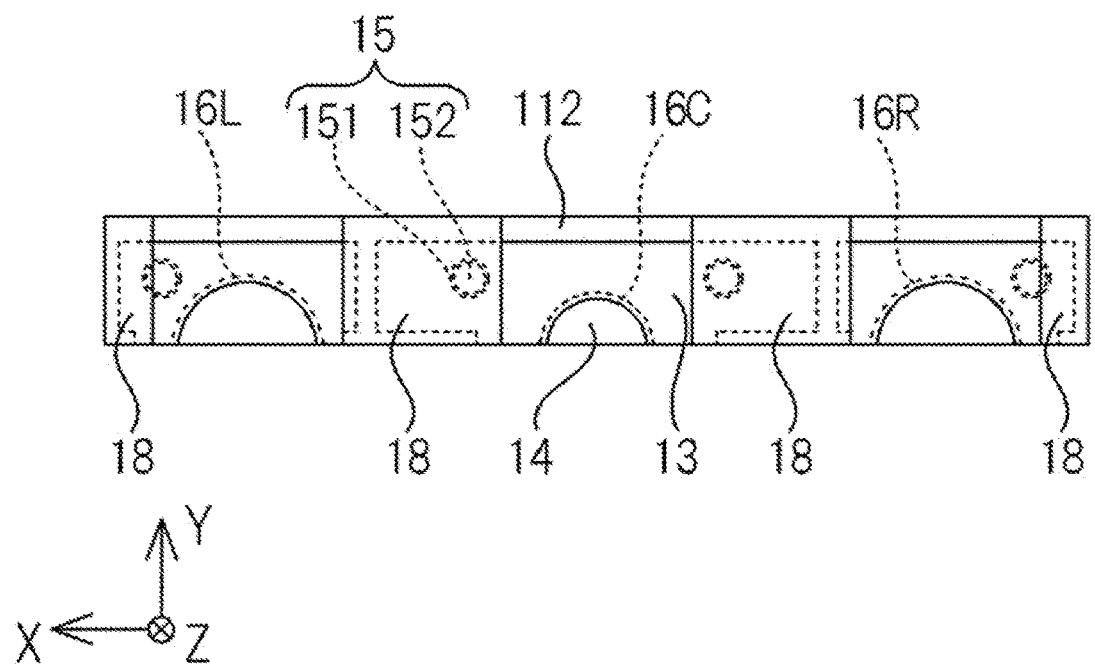
FIG. 4C is a schematic back view of a modification of the light-emitting device according to the first embodiment.

The areas of the openings of the depressed portions in a back view may be the same as or different from each other. For example, in a back view, the opening of a depressed portion 16C located at the center of the base member may has the area larger than the area of the opening of each of a depressed portion 16L located on the X+ side and a depressed portion 16R located on the X− side as shown in FIG. 4B. In back views shown in FIG. 4B, FIG. 4C, and the like, the right side of the center of the light-emitting device in the X axis is referred to as the X+ side, and the left side is referred to as the X− side. Increasing the area of the opening of the depressed portion 16C located at the center of the base member can improve the bonding strength between the light-emitting device and the mounting board. Also, decreasing the areas of the openings of the depressed portion 16L located on the X+ side and the depressed portion 16R located on the X− side makes it easy to increase the areas of the second wirings 13. If the areas of the second wirings 13 are large, inspections can be easily performed in the case where a probe needle is brought into contact with the second wirings in the characteristic inspection or the like of the light-emitting device. Also, in a back view, the area of the opening of each of the depressed portion 16L located on the X+ side and the depressed portion 16R located on the X− side may be larger than the area of the opening of the depressed portion 16C located at the center of the base member as shown in FIG. 4C. Increasing the area of the opening of each of the depressed portion 16L located on the X+ side and the depressed portion 16R located on the X− side can improve the bonding strength between the light-emitting device and the mounting board. Also, in a back view, it is preferable that the areas of the openings of the depressed portion 16L located on the X+ side and the depressed portion 16R located on the X− side be substantially the same with each other. This structure can alleviate a mass imbalance between a bonding member formed inside the depressed portion 16L located on the X+ side and a bonding member formed inside the depressed portion 16R located on the X− side. Accordingly, the light-emitting device is less likely to be inclined after being mounted on the mounting board.

Figure 4D:
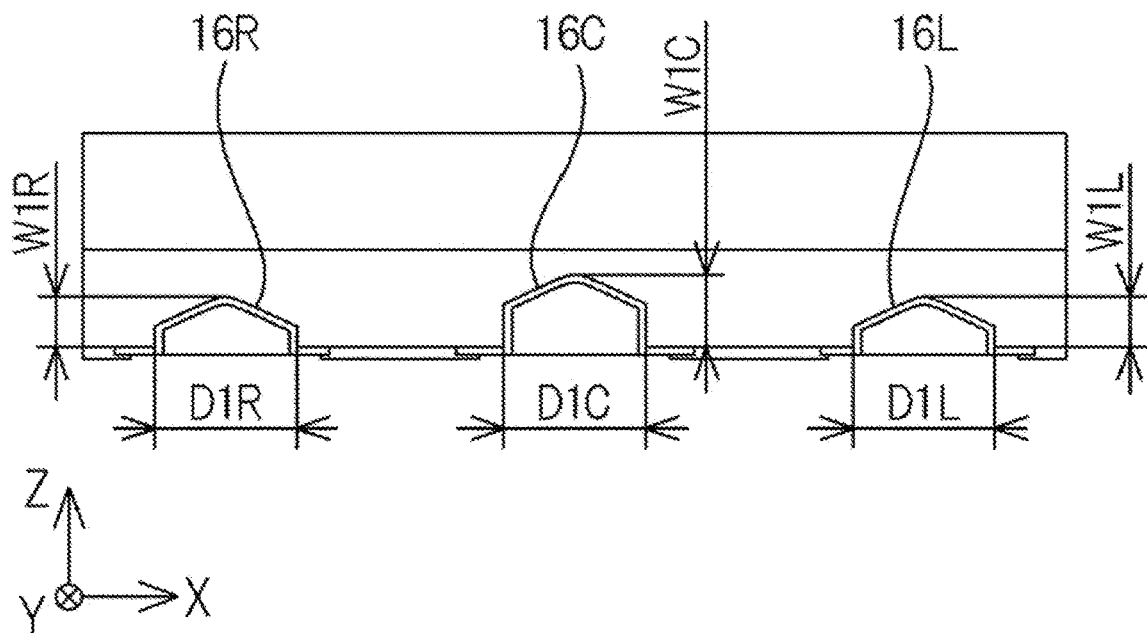
FIG. 4D is a schematic bottom view of a modification of the light-emitting device according to the first embodiment.

The depths of the depressed portions in the Z direction may be the same as shown in the depths W1 of FIG. 3A or the depths W7 of FIG. 3B. Alternatively, the depths of the depressed portions in the Z direction may be different as shown in FIG. 4D. For example, in a bottom view, a depth W1C in the Z direction of the depressed portion 16C located at the center of the base member may be larger than a depth W1L in the Z direction of the depressed portion 16L located on the X+ side and a depth W1R in the Z direction of the depressed portion 16R located on the X− side as shown in FIG. 4D. In bottom views shown in FIG. 4D, FIG. 4E, and FIG. 4F, the left side of the center of the light-emitting device along the X axis is referred to as the X+ side, and the right side is referred to as the X− side. Increasing the depth W1C of the depressed portion 16C located at the center of the base member can improve the bonding strength between the light-emitting device and the mounting board. In a bottom view, the depth W1L in the Z direction of the depressed portion 16L located on the X+ side and the depth W1R in the Z direction of the depressed portion 16R located on the X− side may be larger than the depressed portion W1C in the Z direction of the depressed portion 16C located at the center of the base member. Also, it is preferable that the depth W1L in the Z direction of the depressed portion 16L located on the X+ side is substantially the same as the depth W1R in the Z direction of the depressed portion 16R located on the X− side. This structure facilitates reduction in a mass imbalance between the bonding member formed inside the depressed portion located on the X+ side and the bonding member formed inside the depressed portion located on the X− side. Accordingly, the light-emitting device is less likely to be inclined after being mounted on the mounting board.

Figure 4E:
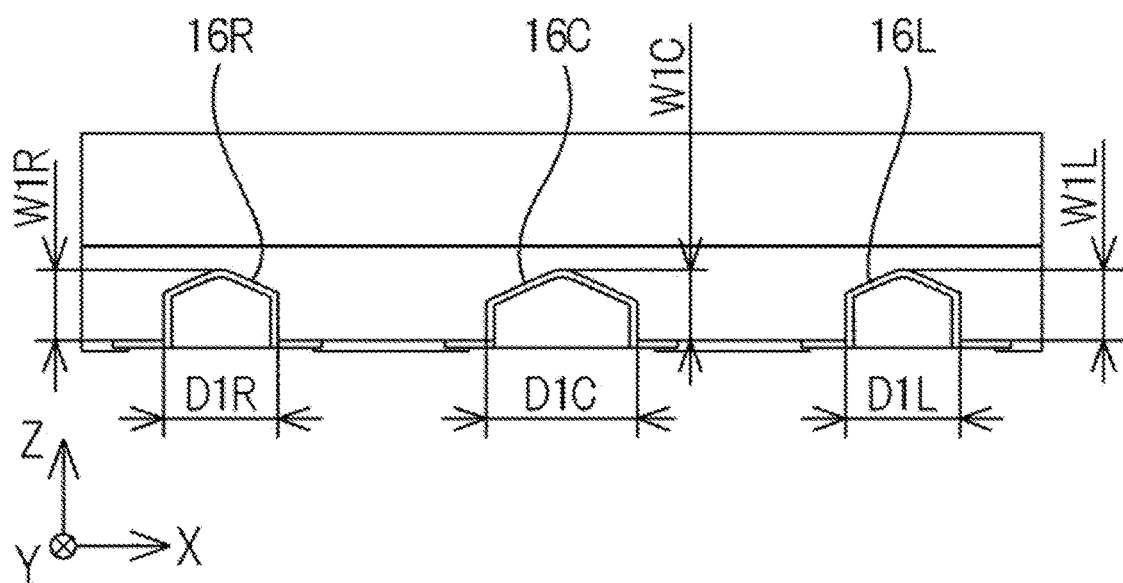
FIG. 4E is a schematic bottom view of a modification of the light-emitting device according to the first embodiment.
Figure 4F:
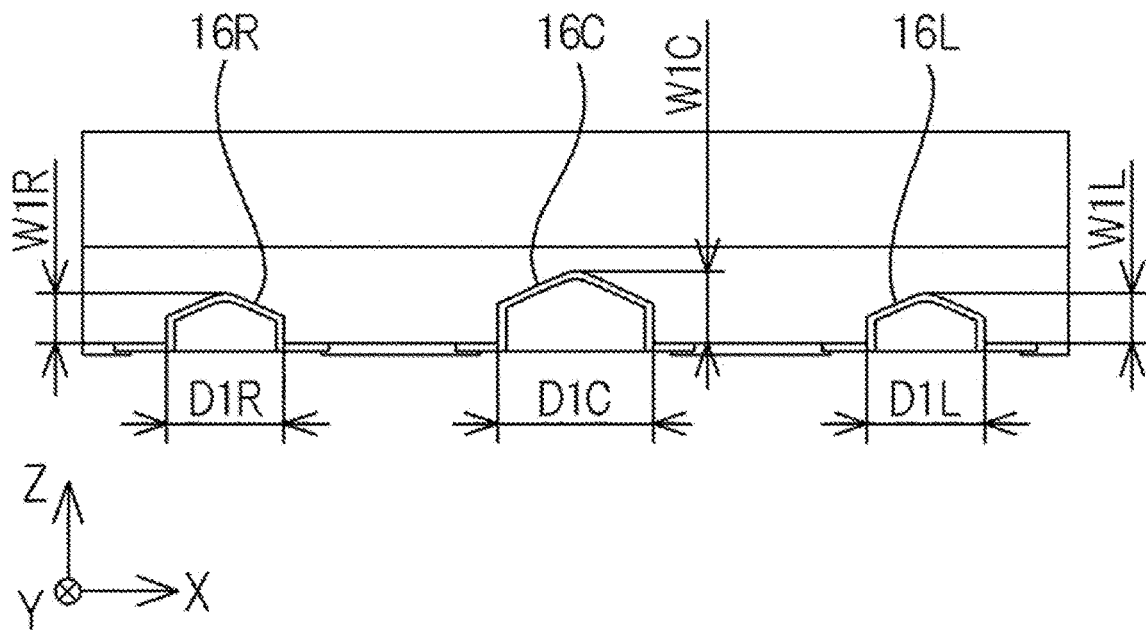
FIG. 4F is a schematic bottom view of a modification of the light-emitting device according to the first embodiment.

In a bottom view, a width D1C in the X direction of the depressed portion 16C located at the center of the base member, a width D1L in the X direction of the depressed portion 16L located on the X+ side, and a width D1R in the X direction of the depressed portion 16R located on the X− side may be substantially the same as shown in FIG. 4D. Alternatively, in a bottom view, the width D1C in the X direction of the depressed portion 16C located at the center of the base member, the width D1L in the X direction of the depressed portion 16L located on the X+ side, and/or the width D1R in the X direction of the depressed portion 16R located on the X− side may be different as shown in FIG. 4E and FIG. 4F. In a bottom view, even in the case where the width D1C in the X direction of the depressed portion 16C located at the center of the base member, the width D1L in the X direction of the depressed portion 16L located on the X+ side, and/or the width D1R in the X direction of the depressed portion 16R located on the X− side are different, the depths in the Z direction of the depressed portions may be the same of different. Also, in a bottom view, it is preferable that the width D1L in the X direction of the depressed portion 16L located on the X+ side be substantially the same as the width D1R in the X direction of the depressed portion 16R located on the X− side. This structure can alleviate a mass imbalance between the bonding member formed inside the depressed portion 16L located on the X+ side and the bonding member formed inside the depressed portion 16R located on the X− side. Accordingly, the light-emitting device is less likely to be inclined after being mounted on the mounting board.

On the back surface, the depressed portions 16 are preferably bilaterally symmetric with respect to the center line of the base member parallel to the second direction (i.e., Y direction). This structure achieves effective self-alignment when the light-emitting device is mounted on or above the mounting board with the bonding members, and the light-emitting device can be precisely mounted within the mounting region.

On the back surface, the opening of each of the depressed portions preferably has a substantially semicircular shape. To form the depressed portion, a circular opening shape can be formed by drilling, and a substantially semicircular shape on the back surface can be easily formed by cutting part of the circular depressed portion by dicing or the like. Also, forming the opening shape of the depressed portion on the back surface into a substantial semicircle without corners can alleviate stress concentration in the depressed portion, and thus can alleviate fracturing of the base member.

Figure 2B:
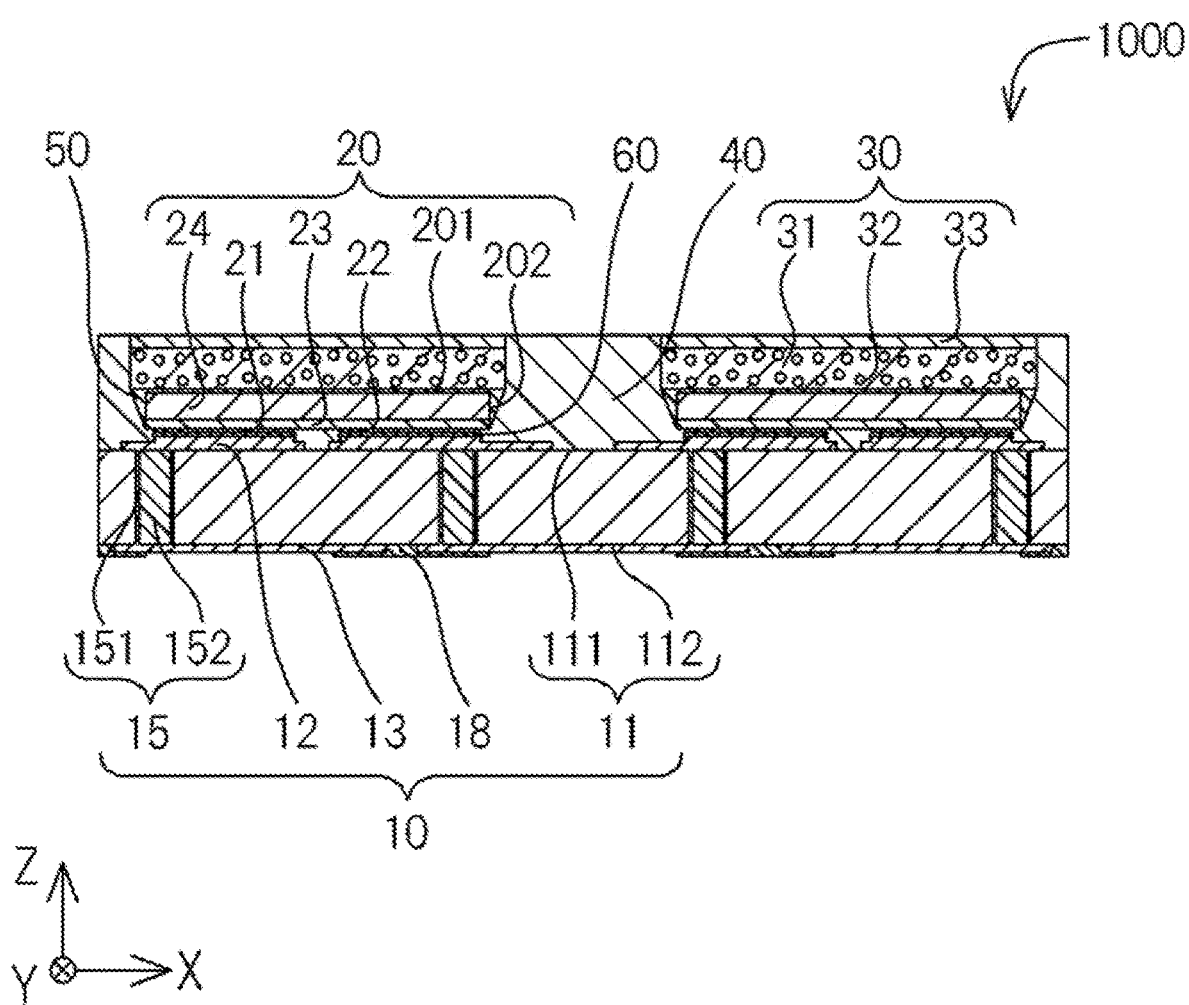
FIG. 2B is a schematic sectional view taken along the line 2B-2B in FIG. 1C.

The light-emitting device 1000 may include light-transmissive members 30 as shown in FIG. 1A, FIG. 2A, and FIG. 2B. The light-transmissive members 30 are preferably positioned on the light-emitting elements 20. Positioning the light-transmissive members on the light-emitting elements protects the light-emitting elements 20 against external stress. The covering member 40 preferably covers the lateral surfaces of the light-transmissive members 30. This structure can make light from the light-emitting device more similar to a point light source. Making the light-emitting device more similar to a point source facilitates, for example, adjustment of light distribution using an optical system such as a lens.

The light-emitting elements 20 each have a mounting surface facing the substrate 10 and a light-extracting surface 201 opposite to the mounting surface. In the case where the light-emitting elements are flip-chip mounted, the surfaces opposite to the surfaces on which positive and negative electrodes of the light-emitting elements are located are used as the light-extracting surfaces as shown in FIG. 2A. The light-transmissive members 30 may be bonded to the light-emitting elements 20 with light-guiding members 50 therebetween. The light-guiding members 50 may be disposed only between the light-extracting surfaces 201 of the light-emitting elements and the light-transmissive members 30 to bond the light-emitting elements 20 and the covering member 40. Alternatively, the light-guiding members 50 may cover the region from the light-extracting surfaces 201 of the light-emitting elements to the lateral surfaces 202 of the light-emitting elements to bond the light-emitting elements 20 to the covering member 40. The light-guiding members 50 have a higher transmittance of light from the light-emitting elements 20 than the transmittance of the covering member 40. Hence, if the light-guiding members 50 cover the lateral surfaces 202 of the light-emitting elements, light emitted from the lateral surfaces of the light-emitting elements 20 can be easily extracted out of the light-emitting device through the light-guiding members 50, thereby enhancing the light extraction efficiency.

In the case where a plurality of light-emitting elements 20 are included, a peak wavelengths of one of the light-emitting elements and the other one of the light-emitting elements may be the same or different. In the case where the peak wavelengths of one of the light-emitting elements and the other one of the light-emitting elements are different, the light-emitting elements preferably include a light-emitting element having an emission peak wavelength in the range of 430 nm to less than 490 nm (i.e., wavelength range in the blue region) and a light-emitting element having an emission peak wavelength in the range of 490 nm to 570 nm (i.e., wavelength range in the green region). This structure can improve color rendering properties of the light-emitting device.

The light-transmissive members 30 may contain a wavelength conversion substance 32 as shown in FIG. 2A and FIG. 2B. The wavelength conversion substance 32 is a member that absorbs at least part of primary light from the light-emitting elements 20 and emits secondary light that differs in wavelengths from the primary light. The light-transmissive members 30 containing the wavelength conversion substance 32 can realize output of mixed light generated by combination of the primary light emitted from the light-emitting elements 20 and the secondary light emitted from the wavelength conversion substance 32. For example, if blue LEDs are used as the light-emitting elements 20 and a phosphor such as YAG is used as the wavelength conversion substance 32, a light-emitting device capable of outputting white light can be obtained by mixing blue light from the blue LEDs and yellow light emitted from the phosphor excited by the blue light.

The wavelength conversion substance may be uniformly dispersed in the light-transmissive members or may be contained more densely in a region near the light-emitting elements than in a region near the upper surfaces of the light-transmissive members 30. This structure allows a matrix 31 of the light-transmissive members 30 to also function as a protective layer, and thus can alleviate deterioration of the wavelength conversion substance 32 even in the case where a wavelength conversion substance 32 that is vulnerable to water is used. Also, the light-transmissive members 30 may each include a layer containing the wavelength conversion substance 32 and a layer 33 containing substantially no wavelength conversion substance as shown in FIG. 2A and FIG. 2B. If the light-transmissive member 30 includes the layer 33 containing substantially no wavelength conversion substance on the layer containing the wavelength conversion substance 32, the layer 33 containing substantially no wavelength conversion substance also functions as a protective layer, and thus can alleviate deterioration of the wavelength conversion substance 32. Examples of the wavelength conversion substance 32 that is vulnerable to water include manganese-activated fluoride phosphors. Manganese-activated fluoride phosphors are suitable in view of color reproducibility because emission of light having a comparatively narrow spectral linewidth can be obtained.

As shown in FIG. 2B, the via holes 15 are disposed inside holes penetrating through the base member 11 from the front surface 111 to the back surface 112. In each of the via holes 15, a fourth wiring 151 covering the surface of the through-hole in the base member and a filler member 152 filled into the fourth wiring 151 may be provided. The filler member 152 may be electrically-conductive or insulative. A resin material is preferably used for the filler member 152. Uncured resin materials generally have higher fluidity than the fluidity of unhardened metal materials, and are easily filled into the fourth wiring 151. Hence, use of a resin material for the filler member facilitates manufacture of the substrate. Examples of the resin material that is easily filled include epoxy resins. In the case where a resin material is used as the filler member, an additive member is preferably contained in order to decrease the coefficient of linear expansion. The difference in the coefficients of linear expansion between the fourth wiring and the filler member is thus reduced, thereby alleviating generation of gaps between the fourth wiring and the filler member due to heat generated from the light-emitting elements. Examples of the additive member include silicon oxide. In the case where a metal material is used as the filler member 152, the heat dissipation can be improved.

As shown in FIG. 4A, the area of each via hole 15 on the back surface is smaller than the area of the opening of each depressed portion 16 on the back surface. Hence, although the via holes 15 penetrate through the base member 11, the mechanical strength of the base member 11 is less likely to be reduced because via holes 15 are smaller in area than the openings of the depressed portions 16 on the back surface.

It is preferable that one of the depressed portions 16 be located between one of the via holes 15 and an adjacent one of the via holes in a back view as shown in FIG. 4A. In other words, in a back view, the depressed portion 16 is preferably located on the straight line connecting the via hole 15 and an the adjacent via hole 15. This structure can enhance efficiency in transfer of heat generated from the light-emitting elements to the via holes 15 and thereafter to the third wirings 14 located inside the depressed portions 16. The heat transferred to the third wirings 14 is transferred to the mounting board via the bonding members, and the heat dissipation of the light-emitting device is thus improved.

Also, it is preferable that one of the via holes 15 be located between one of the depressed portions 16 and an adjacent one of the depressed portions in a back view as shown in FIG. 4A. In other words, in a back view, the via hole 15 is preferably located on the straight line connecting the depressed portion 16 and the adjacent depressed portion 16. This structure can enhance efficiency in transfer of heat generated from the light-emitting elements to the via holes 15 and thereafter to the third wirings 14 located inside the depressed portions. This structure improves the heat dissipation of the light-emitting device.

As shown in FIG. 2B, the light-emitting elements 20 each include at least a semiconductor layered body 23 provided with positive and negative electrodes 21 and 22. Preferably, the positive and negative electrodes 21 and 22 are formed on the same surface of the light-emitting element 20, and the light-emitting element 20 is flip-chip mounted on the substrate 10. This structure eliminates the need for wires through which electricity is supplied to the positive and negative electrodes of the light-emitting element, and thus can downsize the light-emitting device. The light-emitting element 20 includes an element substrate 24 in the present embodiment, but the element substrate 24 may be removed. In the case where the light-emitting element 20 is flip-chip mounted on the substrate 10, the positive and negative electrodes 21 and 22 of the light-emitting element are connected to the first wirings 12 via electrically-conductive adhesive members 60.

In the case where the light-emitting device 1000 includes a plurality of light-emitting elements 20, the light-emitting elements are preferably aligned in the first direction (i.e., X direction) as shown in FIG. 2B. This structure allows the width of the light-emitting device 1000 in the second direction (Y direction) to be smaller, thereby slimming down the light-emitting device. The number of the light-emitting elements may be three or more, or may be one.

Figure 3C:
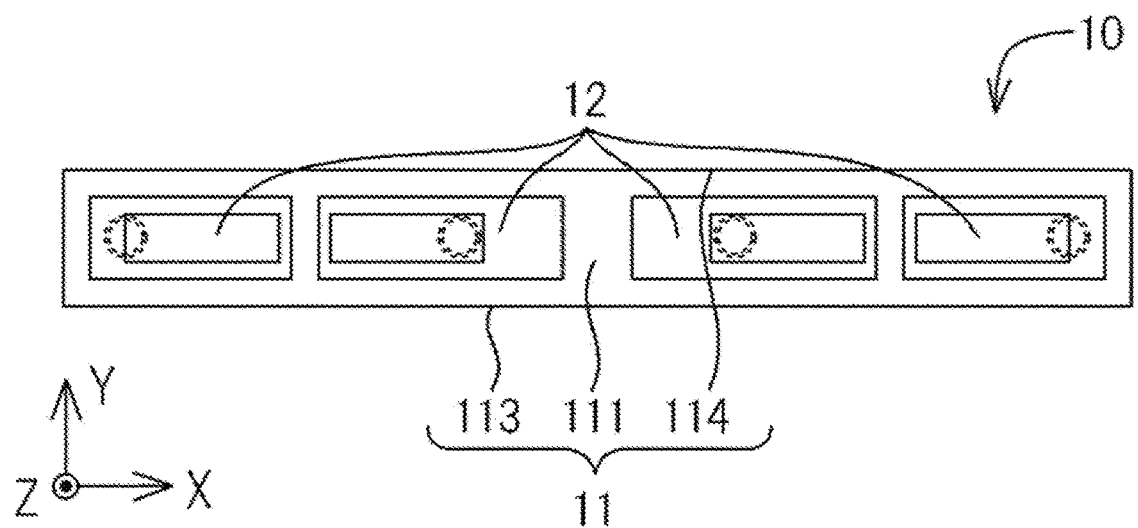
FIG. 3C is a schematic front view of a base member according to the first embodiment.

As shown in FIG. 3C and FIG. 4A, the substrate 10 includes the base member 11, the first wirings 12, and the second wirings 13. The base member 11 has the front surface 111 extending in the first direction, which is the longitudinal direction, and the second direction, which is the width direction; the back surface 112 opposite to the front surface; the bottom surface 113 adjacent and perpendicular to the front surface 111; and the upper surface 114 opposite to the bottom surface 113.

The light-emitting device 1000 may include insulating films 18 covering part of the second wirings 13 as shown in FIG. 4A. Providing the insulating films 18 can ensure insulation and prevent short circuits on the back surface. This can also alleviate peeling of the second wirings from the base member.

Figure 5A:
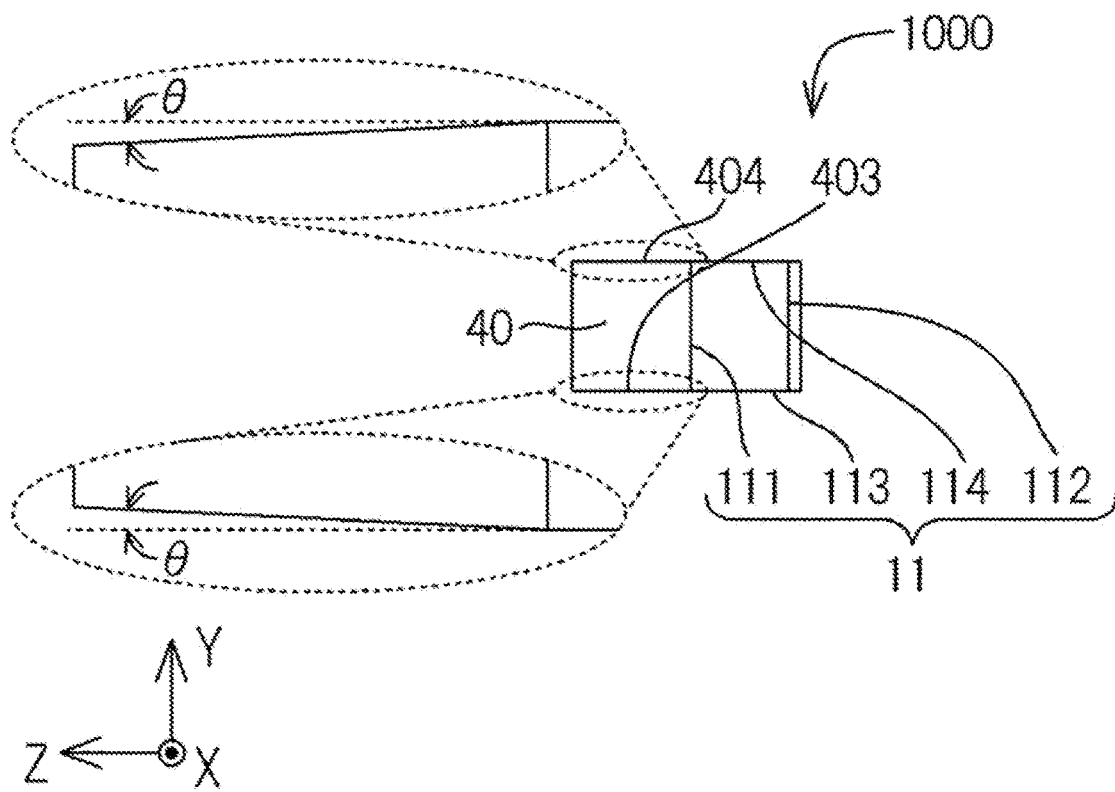
FIG. 5A is a schematic right side view of the light-emitting device in FIG. 1A according to the first embodiment.

A lateral surface 403 of the covering member 40 along the longitudinal direction located on the bottom surface 113 side is preferably inclined toward the inside of the light-emitting device 1000 in the Z direction as shown in FIG. 5A. This structure can alleviate contact of the lateral surface 403 of the covering member 40 with the mounting board when mounting the light-emitting device 1000 on or above the mounting board, thereby easily achieving a stable mounting orientation of the light-emitting device 1000. Also, the structure can reduce the stress generated by contact of the covering member with the mounting board when the covering member 40 is expanded by heat. A lateral surface 404 of the covering member 40 along the longitudinal direction located on the upper surface 114 side is preferably inclined toward the inside of the light-emitting device 1000 in the Z direction. This structure can alleviate contact of the lateral surface of the covering member 40 with a suction nozzle (also referred to as collet), thereby reducing damage to the covering member 40 at the time of suction of the light-emitting device 1000. Also, peripheral members are in contact with the upper surface 114 of the base member 11 in advance of the lateral surface 404 of the covering member 40 when the light-emitting device 1000 is incorporated into a lighting unit or the like, thereby reducing stress on the covering member 40. As described above, the lateral surface 403 of the covering member 40 along the longitudinal direction located on the bottom surface 113 side and the lateral surface 404 of the covering member 40 along the longitudinal direction located on the upper surface 114 side are preferably inclined toward the inside of the light-emitting device 1000 in the direction (i.e., Z direction) from the back surface toward the front surface. An inclination angle θ of the covering member 40 can be appropriately selected but is preferably in the range of 0.3° to 3°, more preferably 0.5° to 2°, even more preferably 0.7° to 1.5°, in view of ease of exerting such effects and the strength of the covering member 40.

Figure 5B:
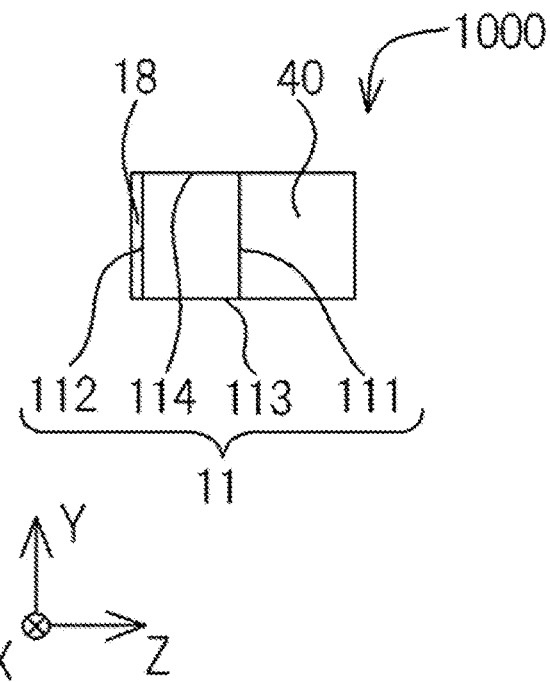
FIG. 5B is a schematic left side view of the light-emitting device in FIG. 1A according to the first embodiment.

The right and left lateral surfaces of the light-emitting device 1000 preferably have substantially the same shape as shown in FIG. 5A and FIG. 5B. This structure enables miniaturization of the light-emitting device 1000.

Figure 6:
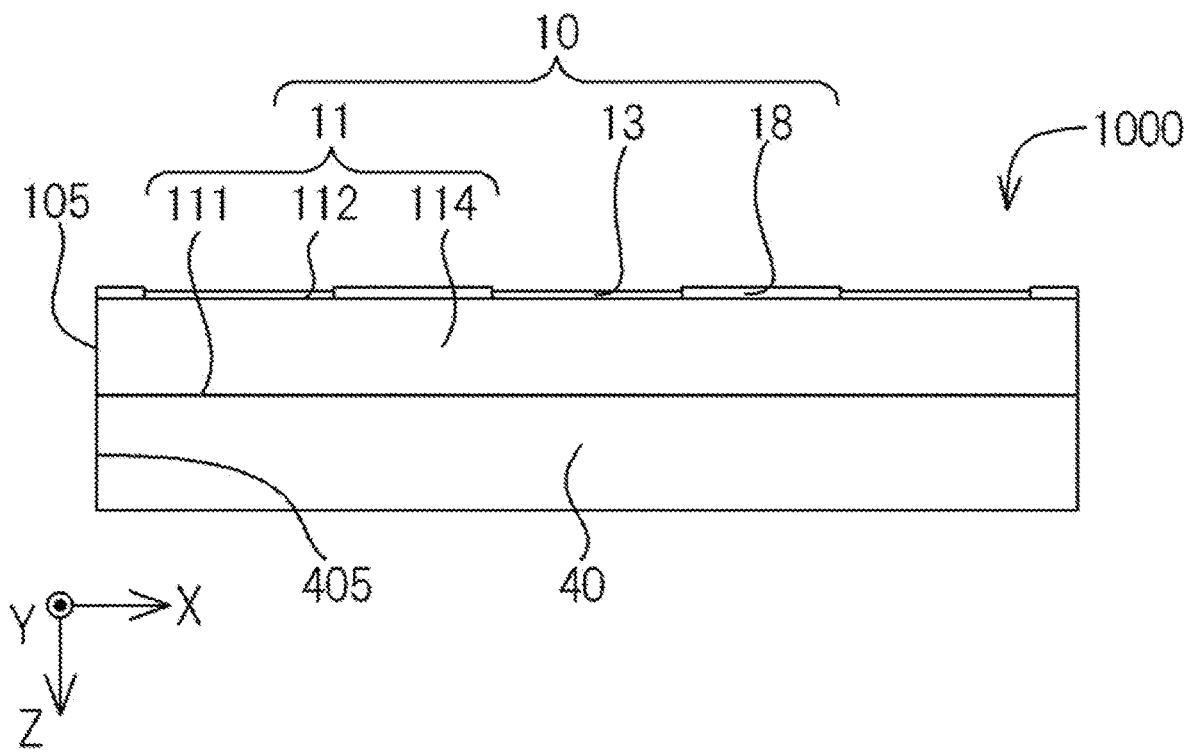
FIG. 6 is a schematic top view of the light-emitting device according to the first embodiment.
Figure 7:
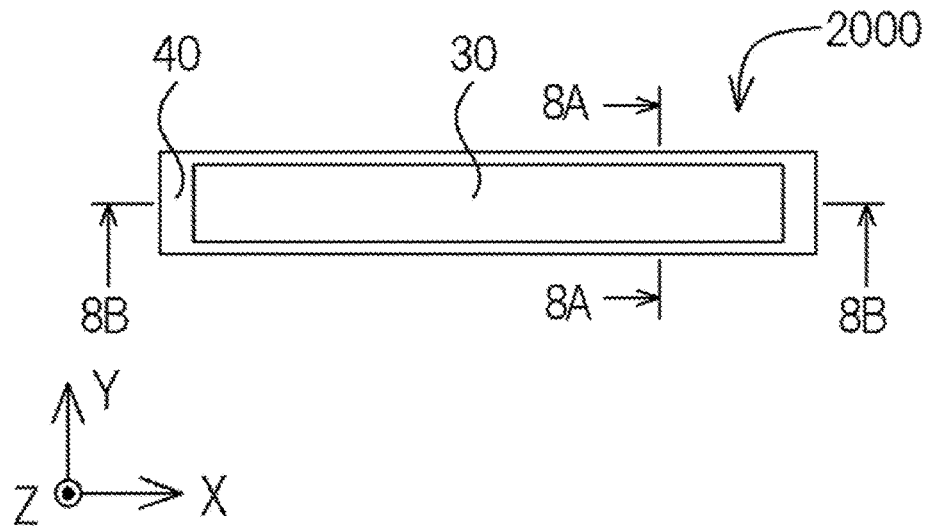
FIG. 7 is a schematic front view of a light-emitting device according to a second embodiment.

It is preferable that a lateral surface 405 of the covering member 40 along the width direction be substantially flush with a lateral surface 105 of the substrate 10 along the width direction as shown in FIG. 6. This structure allows the length in the longitudinal direction (X direction) to be smaller, thereby miniaturizing the light-emitting device.

Second Embodiment

A light-emitting device 2000 according to a second embodiment of the present disclosure shown in FIG. 7 to FIG. 9B and the light-emitting device 1000 according to the first embodiment are different in the number of light-emitting elements mounted on the substrate and the numbers of depressed portions and via holes included in the base member. The shape of the depressed portions 16 is the same as the shape in the first embodiment.

Figure 8A:
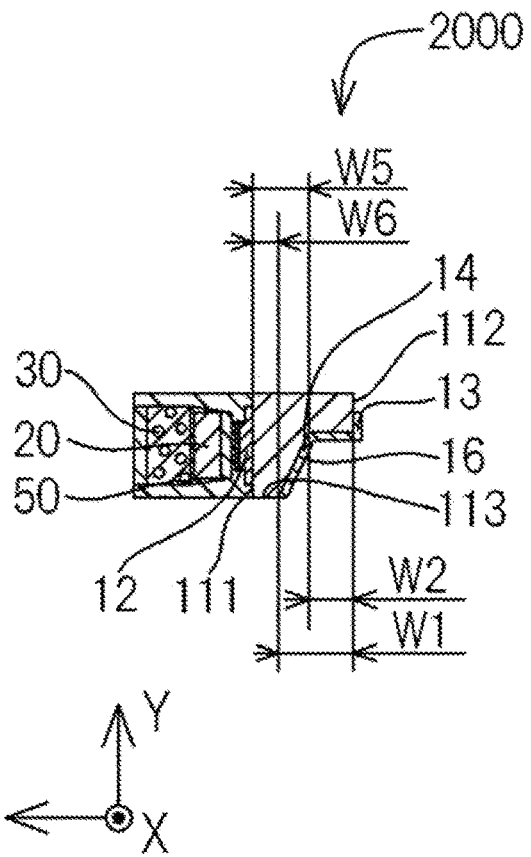
FIG. 8A is a schematic sectional view taken along the line 8A-8A in FIG. 7.

As shown in FIG. 8A, the depth of each depressed portion from the back surface toward the front surface of the light-emitting device 2000 is larger on the bottom surface side than on the upper surface side as in the first embodiment. Hence, the thickness of the base member on the upper surface side of the depressed portion can be larger than the thickness of the base member on the bottom surface side of the depressed portion. This structure can alleviate decrease in the mechanical strength of the base member. Also, the depressed portion having a greater depth on the bottom surface side can increase the volume of the bonding member formed inside the depressed portion, thereby improving the bonding strength between the light-emitting device 2000 and the mounting board.

Figure 8B:
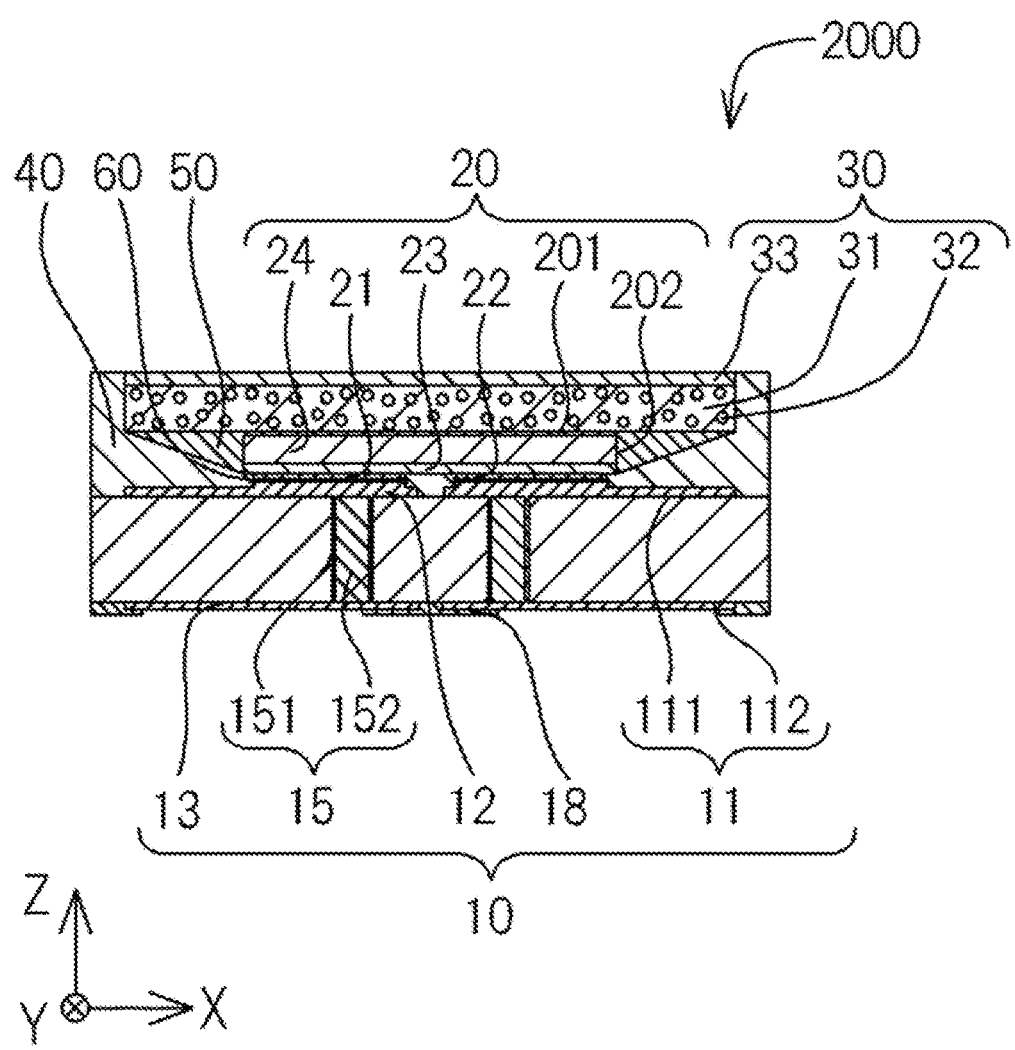
FIG. 8B is a schematic sectional view taken along the line 8B-8B in FIG. 7.
Figure 9A:
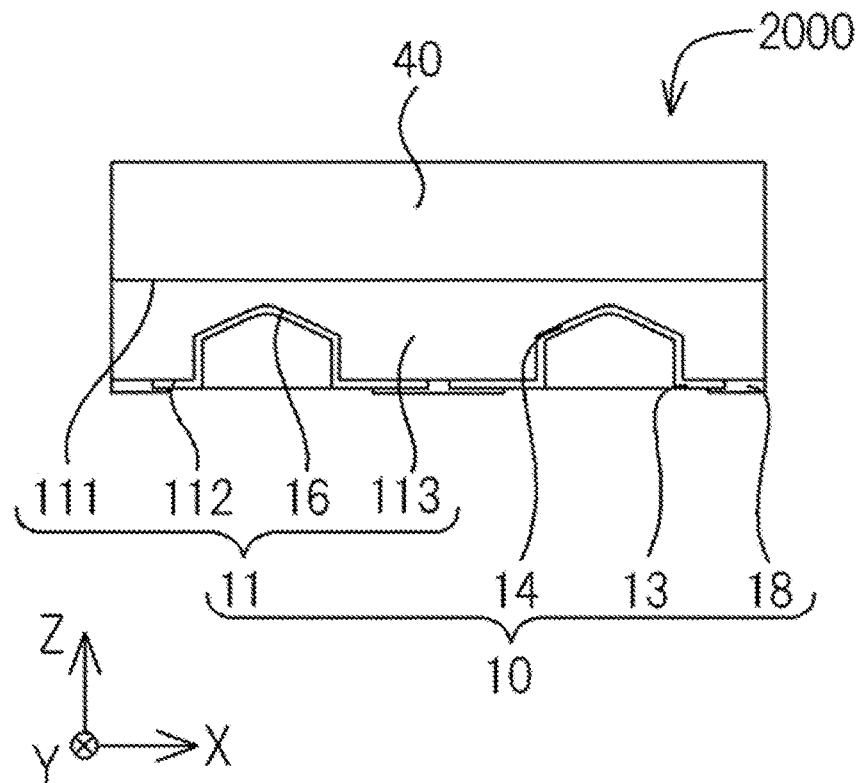
FIG. 9A is a schematic bottom view of the light-emitting device according to the second embodiment.

The number of the light-emitting element may be one as shown in FIG. 8B. If only one light-emitting element is mounted in the light-emitting device, the length in the first direction (i.e., X direction) can be smaller than in the case where a plurality of light-emitting elements are mounted, thereby miniaturizing the light-emitting device. The number of the depressed portions may also be changed as appropriate in accordance with reduction in the length of the light-emitting device in the first direction (i.e., X direction). For example, the number of the depressed portions 16 may be two as shown in FIG. 9A. The number of the depressed portions 16 may be one, or may be three or more.

Figure 9B:
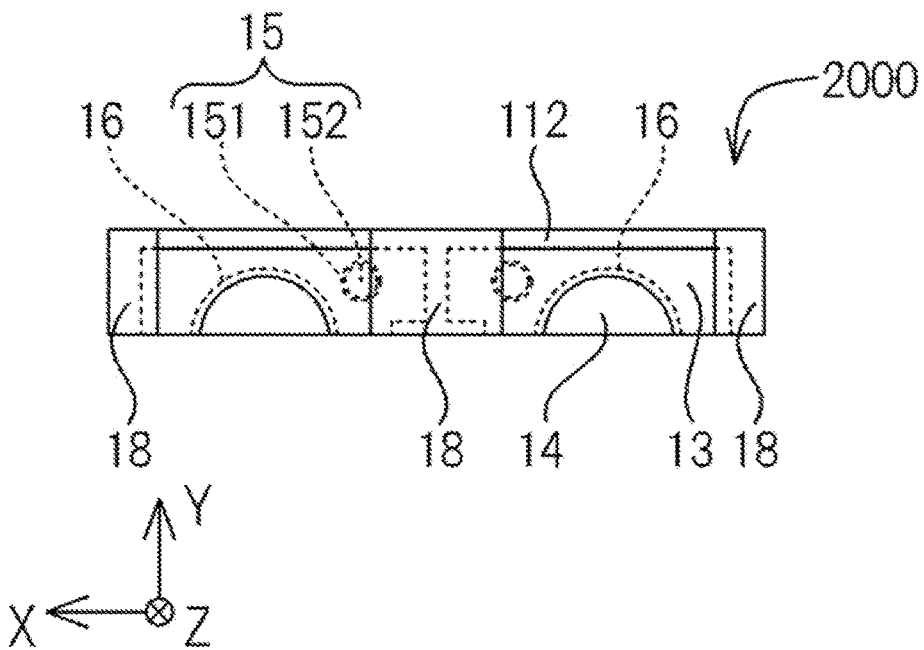
FIG. 9B is a schematic back view of the light-emitting device according to the second embodiment.
Figure 10:
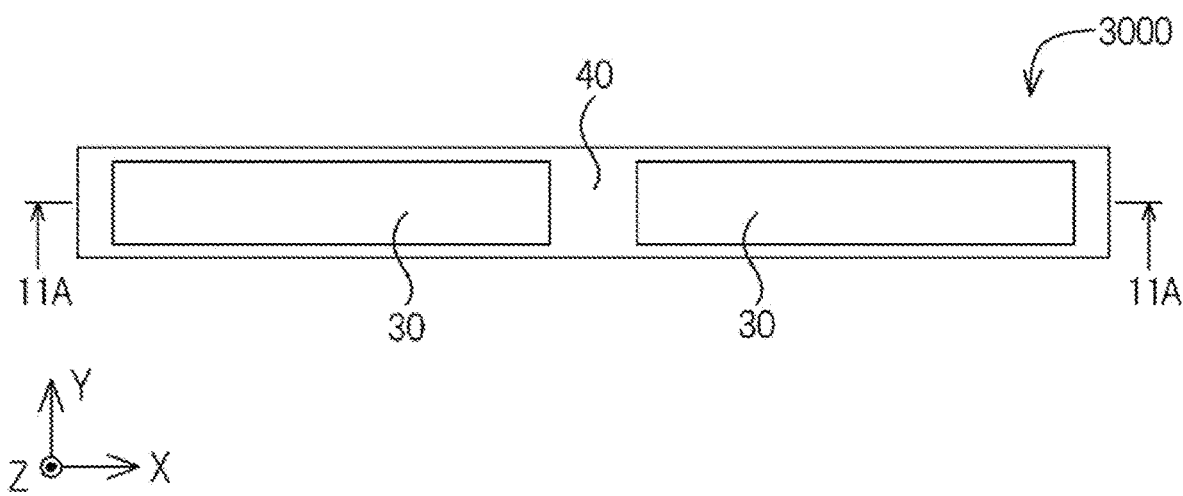
FIG. 10 is a schematic front view of a light-emitting device according to a third embodiment.
Figure 11:
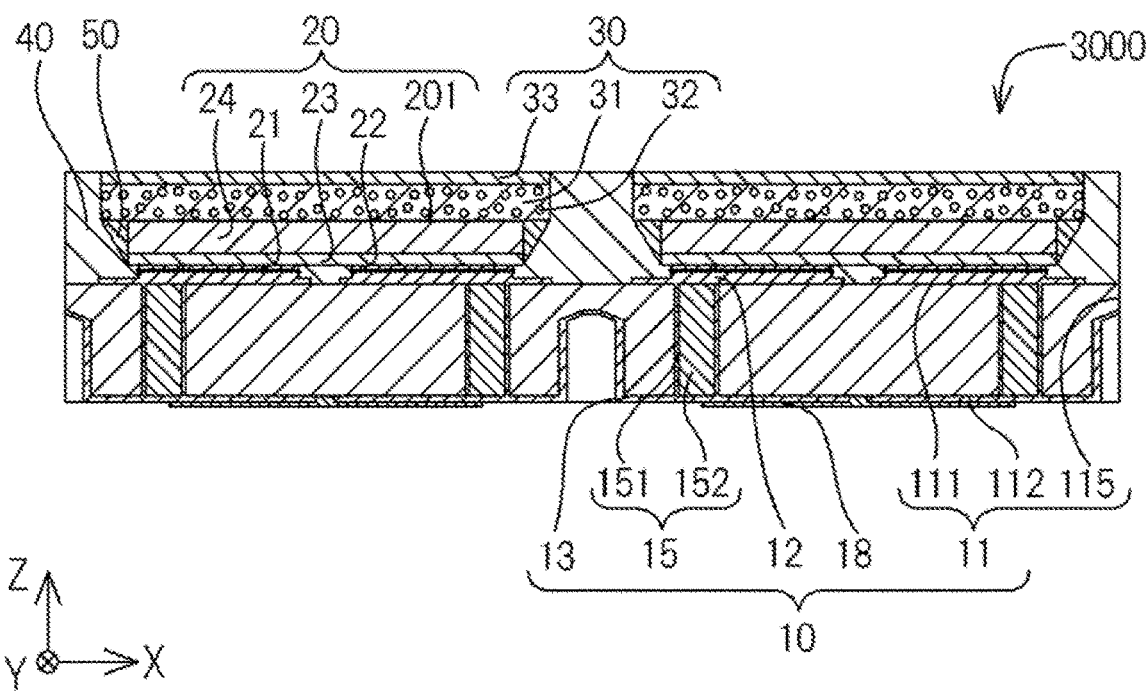
FIG. 11 is a schematic sectional view taken along the line 11A-11A in FIG. 10.
Figure 12:
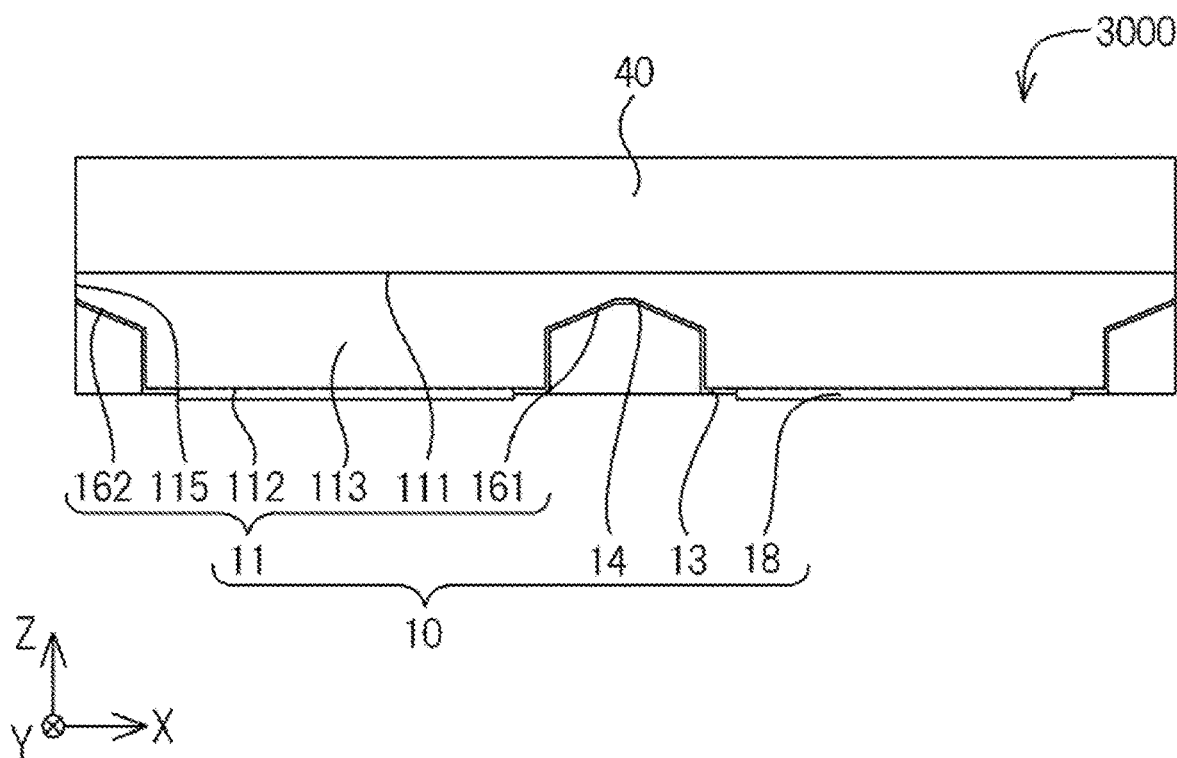
FIG. 12 is a schematic bottom view of the light-emitting device according to the third embodiment.
Figure 13:
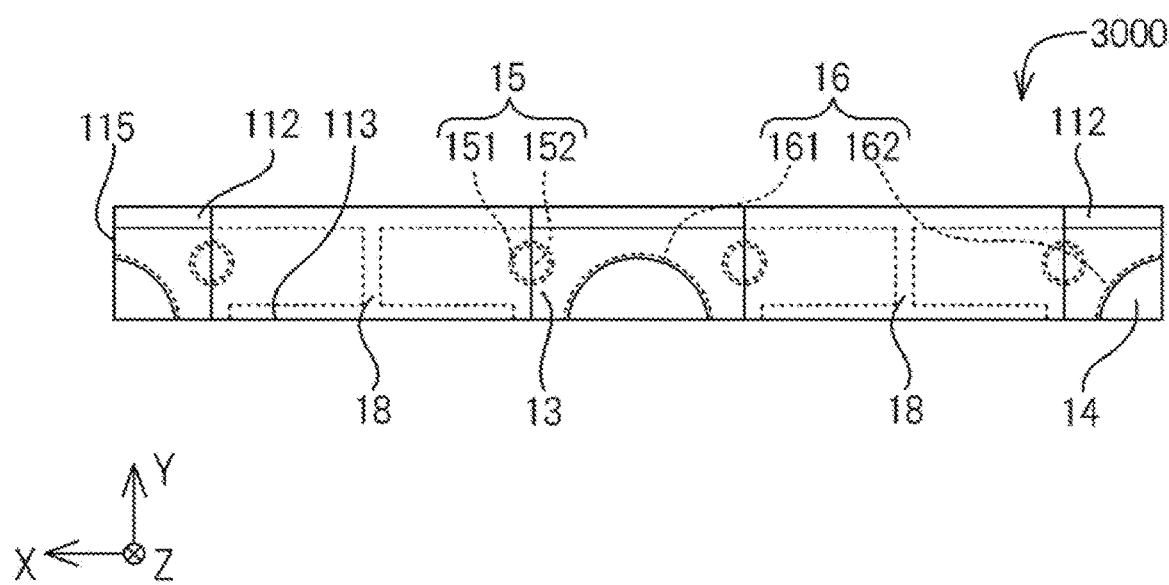
FIG. 13 is a schematic back view of the light-emitting device according to the third embodiment.

It is preferable that a plurality of via holes 15 be located between one of the depressed portions 16 and an adjacent one of the depressed portions 16 in a back view as shown in FIG. 9B. In other words, in a back view, a plurality of via holes 15 are preferably located on the straight line connecting the one of the depressed portions 16 and the adjacent one of the depressed portions 16. This structure can enhance efficiency in transfer of heat generated from the light-emitting elements to via holes 15 and thereafter to the third wirings 14 located inside the depressed portions. This structure can improve the heat dissipation performance of the light-emitting device.

Third Embodiment

A light-emitting device 3000 according to a third embodiment of the present disclosure shown in FIG. 10 to FIG. 14 and the light-emitting device 1000 according to the first embodiment are different in the shapes of the depressed portions 16.

The light-emitting device 3000 includes the substrate 10, one or more light-emitting elements 20, and the covering member 40, like the light-emitting device 1000. The substrate 10 includes the base member 11, the first wirings 12, the second wirings 13, the third wirings 14, and the via holes 15. The base member 11 has the front surface 111 extending in the first direction, which is the longitudinal direction, and the second direction, which is the width direction; the back surface 112 opposite to the front surface; the bottom surface 113 adjacent and perpendicular to the front surface 111; the upper surface 114 opposite to the bottom surface 113; and lateral surfaces 115 between the front surface 111 and the back surface 112. The base member 11 further includes a plurality of depressed portions 16. The depressed portions 16 include: a central depressed portion 161 that opens on the back surface 112 and the bottom surface 113; and edge depressed portions 162 that open on the back surface 112, the bottom surface 113, and the lateral surfaces 115. The third wirings 14 cover the inner walls of the depressed portions 16 and are electrically connected to the second wirings 13.

Figure 14:
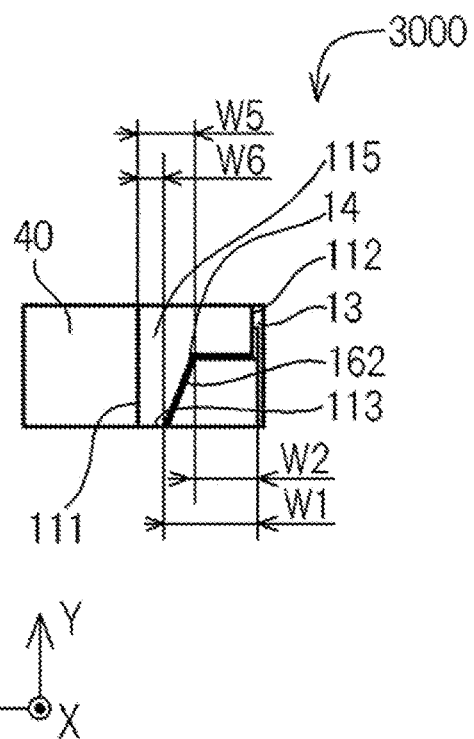
FIG. 14 is a schematic right side view of the light-emitting device according to the third embodiment as seen from the front surface of the light-emitting device.

As shown in FIG. 14, the depths of the central depressed portion 161 and/or the edge depressed portions 162 from the back surface toward the front surface of the light-emitting device 3000 are larger on the bottom surface side than on the upper surface side. Hence, the thickness of the base member on the upper surface side of the central depressed portion 161 and/or the edge depressed portions 162 can be larger than the thickness of the base member on the bottom surface side of the central depressed portion 161 and/or the edge depressed portions 162. This structure can alleviate decrease in the mechanical strength of the base member. Also, the central depressed portion 161 and/or the edge depressed portions 162 having a greater depth on the bottom surface side can increase the volumes of the bonding members formed inside the central depressed portion 161 and/or the edge depressed portions 162, thereby improving the bonding strength between the light-emitting device 3000 and the mounting board. The number of the central depressed portion 161 and/or the edge depressed portion 162 is at least one.

As shown in FIG. 11 to FIG. 14, the edge depressed portions 162 open also on the lateral surfaces 115 of the base member. This structure allows the bonding members to be located on the lateral surfaces 115 sides of the base member, thereby further improving the bonding strength between the light-emitting device 3000 and the mounting board. In the case where the light-emitting device 3000 is mounted as a side-view type such that the bottom surface 113 of the base member 11 faces the mounting board, having the edge depressed portions 162 is particularly preferable. Having the edge depressed portions 162 can achieve fixation of the lateral surfaces 115 of the base member, thereby preventing or alleviate the Manhattan phenomenon, in which the light-emitting device 3000 inclines on the mounting board, or in which the back surface of the base member stands to face the mounting board. It is sufficient to have at least one edge depressed portion 162, but having a plurality of edge depressed portions 162 is preferable. Having a plurality of edge depressed portions 162 can further improve the bonding strength between the light-emitting device 3000 and the mounting board. In the case where a plurality of edge depressed portions 162 are formed, the edge depressed portions are preferably located on both ends of the base member in the longitudinal direction (i.e., X direction) in a back view. This structure can further prevent or alleviate the Manhattan phenomenon.

In a back view, in the case where the shape of the central depressed portion 161 is a substantial semicircle, which is half of a circle, and in the case where the shape of the edge depressed portions 162 is a substantial quarter of a circle, the diameters of the circles of the central depressed portion 161 and the edge depressed portions 162 may be different or substantially the same. It is preferable that the diameters of the circles of the central depressed portion 161 and the edge depressed portions 162 be substantially the same because the central depressed portion 161 and the edge depressed portions 162 can be formed with one drill. Also, for example, the central depressed portion 161 and the edge depressed portions 162 include inclined portions inclined from the bottom surface 113 as the thickness of the base member 11 becomes larger in a sectional view in Z direction, the angles of the inclined portion of the central depressed portion 161 and the inclined portions of the edge depressed portions 162 may be different or substantially the same. It is preferable that the angles of the inclined portion of the central depressed portion 161 and the inclined portions of the edge depressed portions 162 be substantially the same because the central depressed portion 161 and the edge depressed portions 162 can be formed with one drill.

Figure 15:
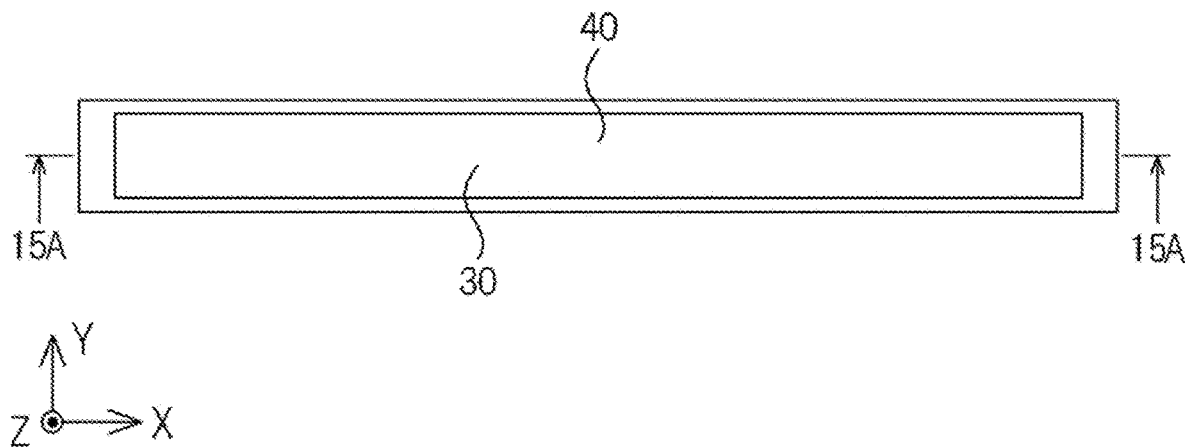
FIG. 15 is a schematic front view of a modification of the light-emitting device according to the third embodiment.
Figure 16:
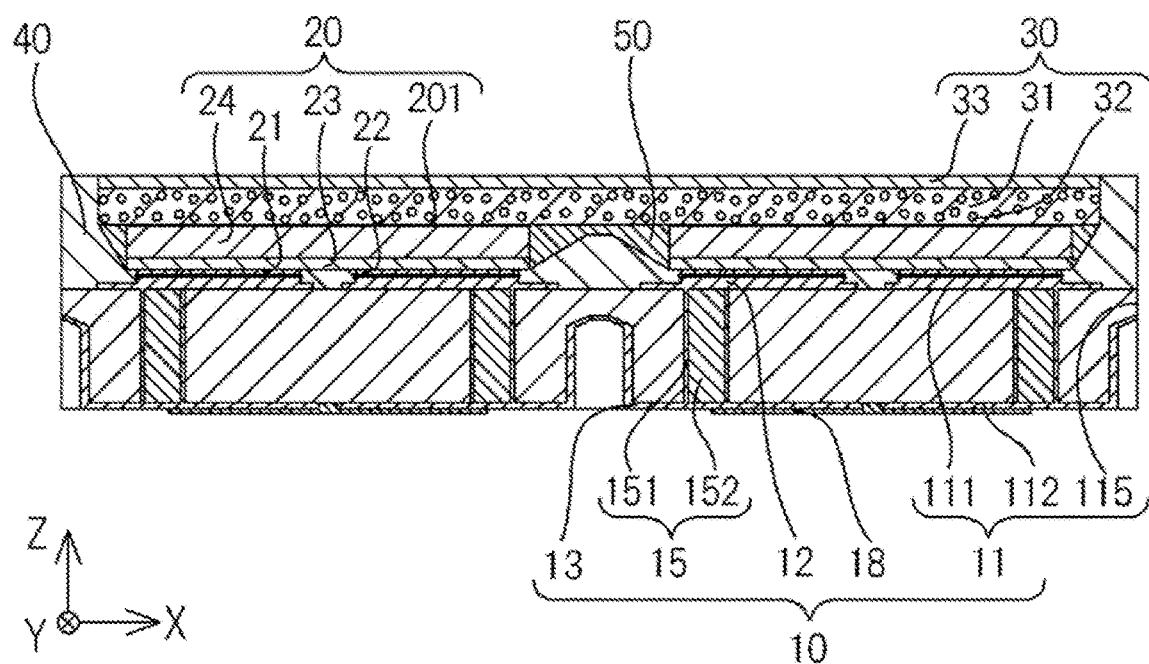
FIG. 16 is a schematic sectional view taken along the line 15A-15A in FIG. 15.
Figure 17:
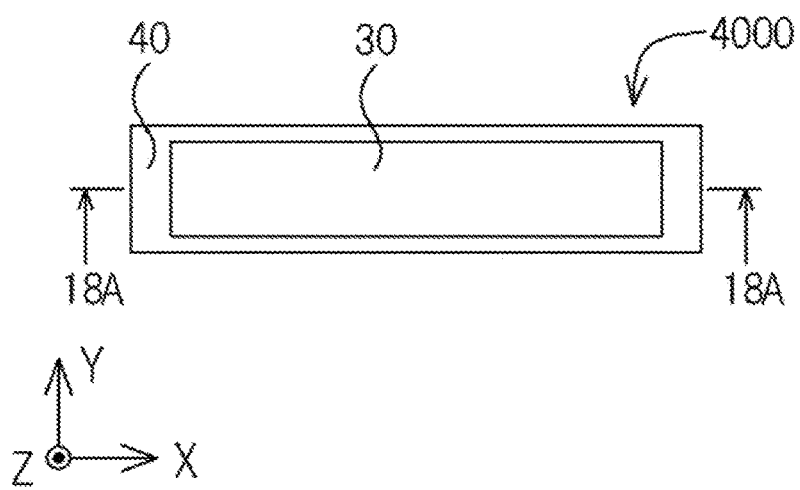
FIG. 17 is a schematic front view of a light-emitting device according to a fourth embodiment.
Figure 18:
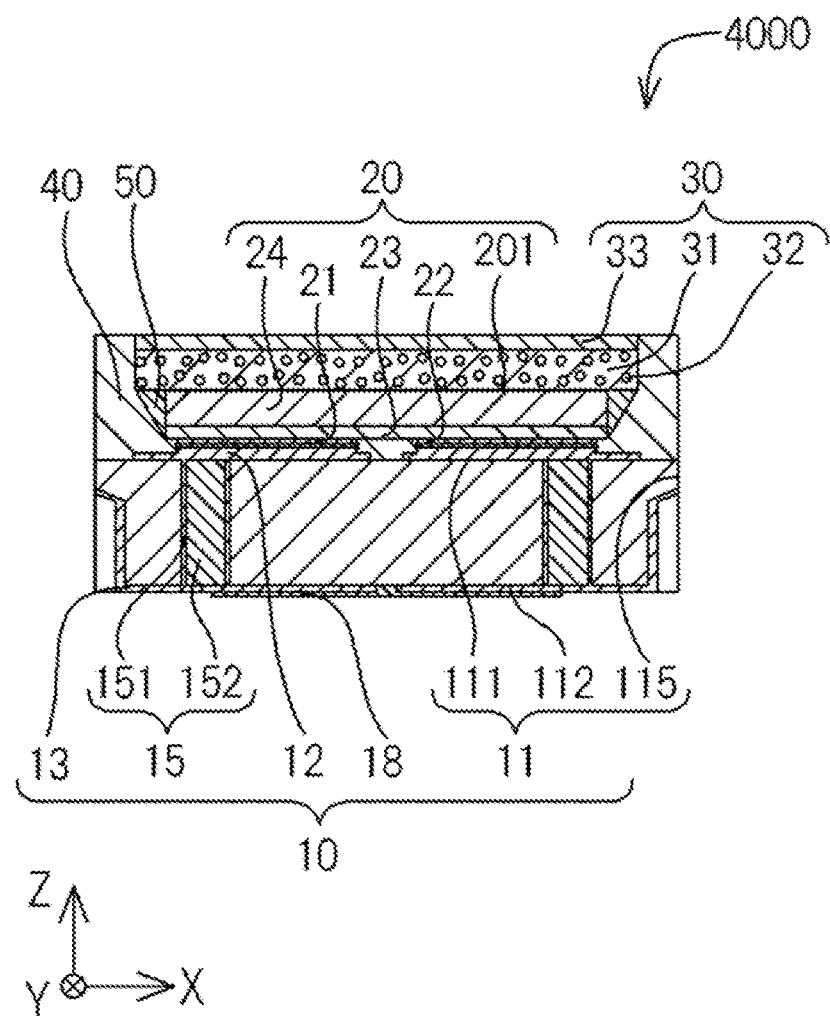
FIG. 18 is a schematic sectional view taken along the line 18A-18A in FIG. 17.
Figure 19:
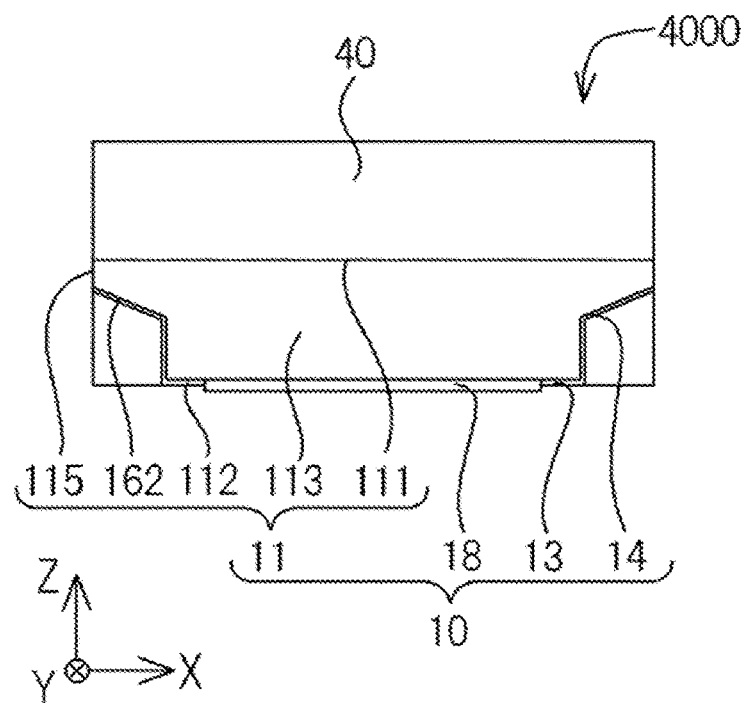
FIG. 19 is a schematic bottom view of the light-emitting device according to the fourth embodiment.
Figure 20:
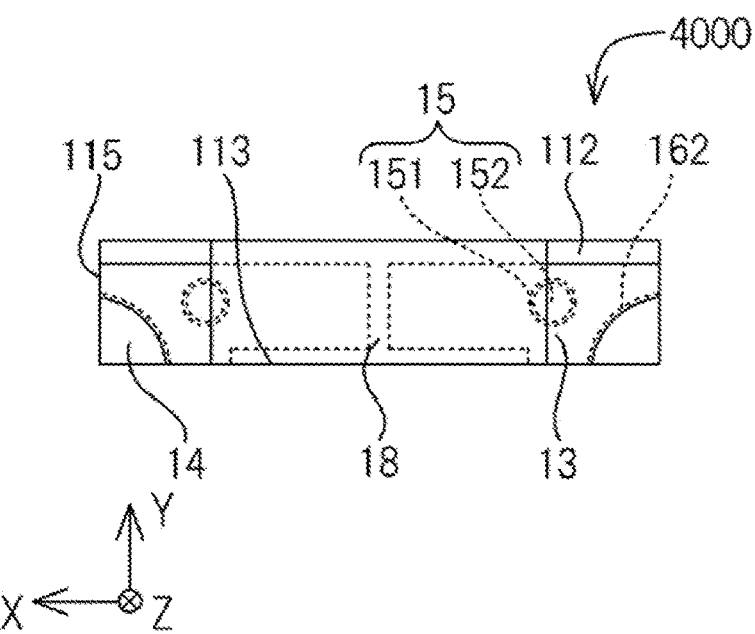
FIG. 20 is a schematic back view of the light-emitting device according to the fourth embodiment.

As shown in FIG. 15 and FIG. 16, one light-transmissive member 30 may be disposed on a plurality of light-emitting elements. This structure can increase the area of the light-transmissive member in a front view, thereby improving the light extraction efficiency of the light-emitting device. Also, having only one emitting surface on the light-emitting device can alleviate the luminance non-uniformity of the light-emitting device.

In the case where one light-transmissive member 30 is located on a plurality of light-emitting elements, the light-guiding members 50 bonding the light-emitting elements 20 to the light-transmissive member 30 may be connected to or separated from each other. A light-guiding member preferably fills the gap between one of the light-emitting elements and the other one of the light-emitting elements as shown in FIG. 16. This structure enables the light-guiding member to guide light emitted from the light-emitting elements in a gap between the one of the light-emitting elements and the other one of the light-emitting elements to the light-transmissive member, and thus can reduce the luminance non-uniformity of the light-emitting device. This structure can also narrow a portion of the covering member located between the one of the light-emitting elements and the other one of the light-emitting elements thereby alleviating deterioration of the covering member due to light from the light-emitting elements. A material of the light-guiding member is preferably one that is less likely deteriorated by light from the light-emitting elements than the material for the covering member.

Fourth Embodiment

A light-emitting device 4000 according to a fourth embodiment of the present disclosure shown in FIG. 17 to FIG. 21 and the light-emitting device 2000 according to the second embodiment are different in the shapes of the depressed portions 16.

Figure 21:
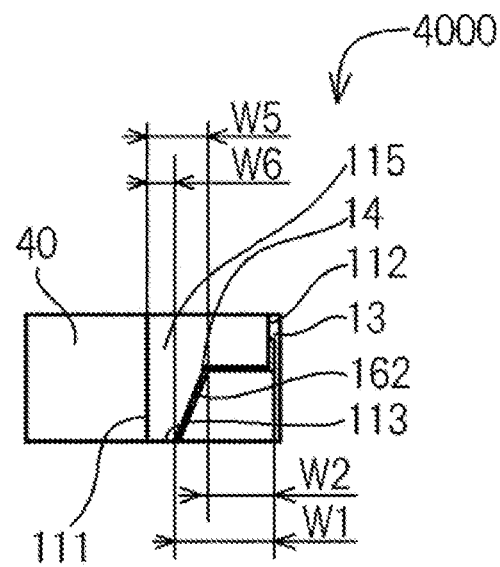
FIG. 21 is a schematic right side view of the light-emitting device according to the fourth embodiment.

As shown in FIG. 21, the light-emitting device 4000 includes the edge depressed portions 162. The edge depressed portions from the back surface toward the front surface has the depth larger on the bottom surface side than on the upper surface side. Hence, the thickness of the base member on the upper surface side of the edge depressed portions can be larger than the thickness of the base member on the bottom surface side of the depressed portions. This structure can alleviate decrease in the strength of the base member. Also, the edge depressed portions having the greater depth on the bottom surface side can increase the volumes of the bonding members formed inside the edge depressed portions, thereby improving the bonding strength between the light-emitting device 4000 and the mounting board.

As shown in FIG. 18 to FIG. 21, the edge depressed portions 162 open also to the lateral surfaces 115 of the base member. This structure allows the bonding members to be located on the lateral surfaces 115 sides of the base member, thereby further improving the bonding strength between the light-emitting device 4000 and the mounting board.

Fifth Embodiment

Figure 22:
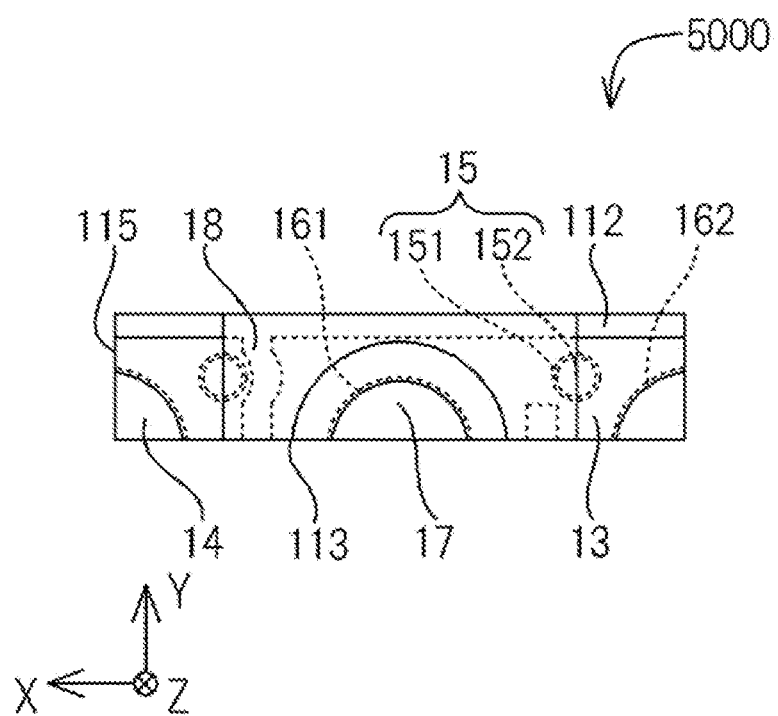
FIG. 22 is a schematic back view of a light-emitting device according to a fifth embodiment.

A light-emitting device 5000 according to a fifth embodiment of the present disclosure shown in FIG. 22 and the light-emitting device 4000 according to the fourth embodiment are different in that the central depressed portion 161 is formed.

The light-emitting device 5000 has the central depressed portion 161 and the edge depressed portions 162, thereby increasing portions to be bonded with the bonding members, resulting in improvement of the bonding strength between the light-emitting device and the mounting board. The central depressed portion 161 and/or the edge depressed portions 162 from the back surface toward the front surface have depths larger on the bottom surface side than on the upper surface side. This structure can improve the bonding strength between the light-emitting device 5000 and the mounting board.

Sixth Embodiment

Figure 23:
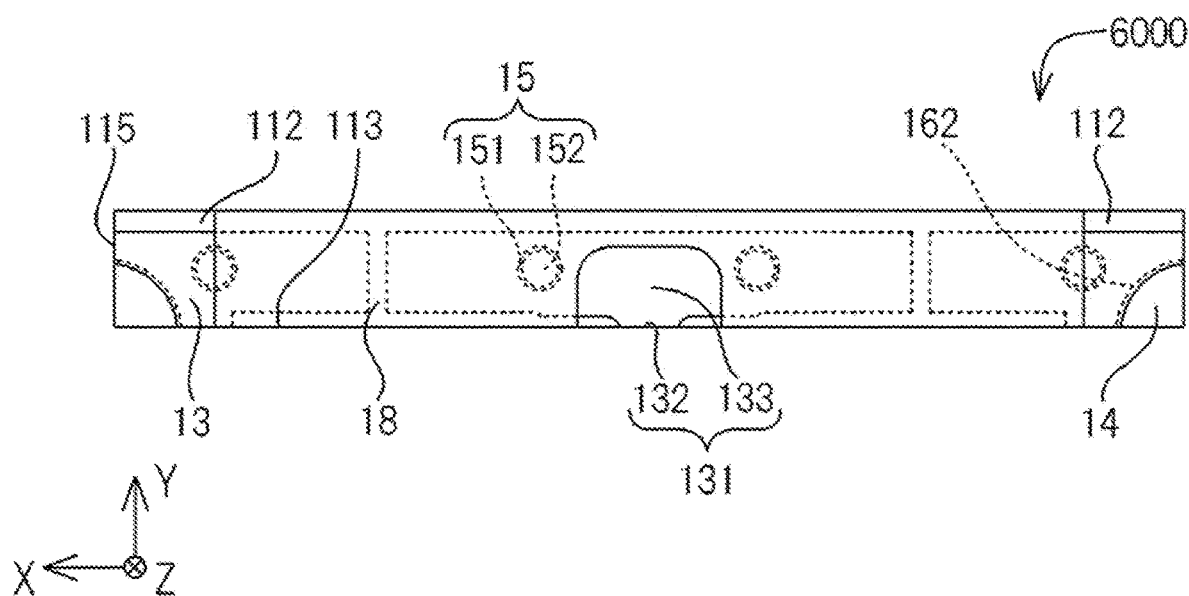
FIG. 23 is a schematic back view of a light-emitting device according to a sixth embodiment.

A light-emitting device 6000 according to a sixth embodiment of the present disclosure shown in FIG. 23 and the light-emitting device 1000 according to the first embodiment are different in the shapes of the second wirings and the insulating film and in that the depressed portion at the center of the light-emitting device (i.e., central depressed portion) is not formed.

In a back view, second wirings 13 of the light-emitting device 6000 are located between two edge depressed portions, and includes an exposed portion 131 exposed from the insulating film 18. The exposed portion 131 on the back surface is surrounded by the insulating film 18 except for the bottom surface 113 side. Disposing a bonding member on the exposed portion 131 can improve the bonding strength between the light-emitting device and the mounting board. The shape of the exposed portion 131 in a back view may be appropriately selected, for example, it can be quadrilaterals and hemispheres. The shape of the exposed portion 131 in a back view can be easily changed by changing the shape of the insulating film. The shape of the exposed portion 131 in a back view preferably includes a narrow portion 132 on the bottom surface side and a wide portion 133 positioned at an area extending in the second direction (i.e., Y direction). Providing the narrow portion can alleviate intrusion of a flux or the like contained in the bonding member into the gap below the light-emitting element along the surface of the exposed portion 131 when the light-emitting device is mounted. Also, the shape of the second wiring 13 exposed from the insulating film 18 is preferably bilaterally symmetric with respect to the center line of the base member parallel to the second direction (i.e., Y direction). This structure can achieve effective self-alignment when the light-emitting device is mounted on or above the mounting board with the bonding members, and the light-emitting device can be precisely mounted within the mounting region.

Seventh Embodiment

Figure 24:
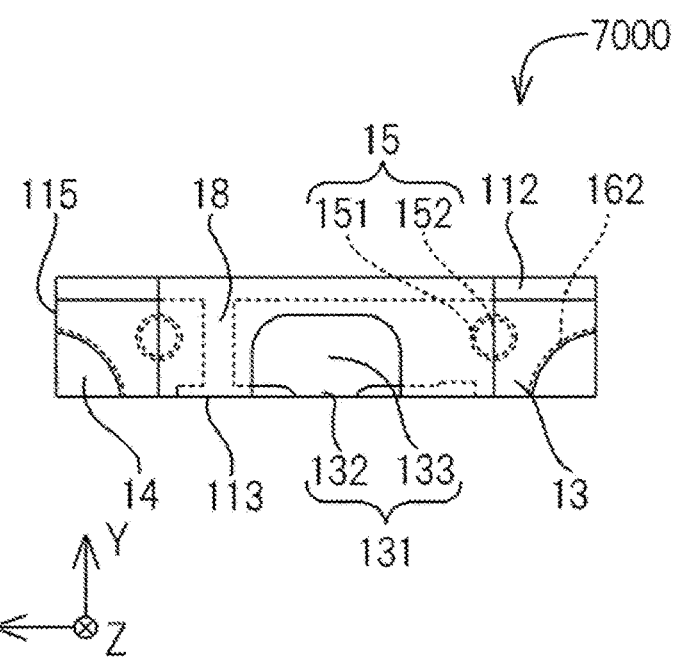
FIG. 24 is a schematic back view of a light-emitting device according to a seventh embodiment.

A light-emitting device 7000 according to a seventh embodiment of the present disclosure shown in FIG. 24 and the light-emitting device 4000 according to the fourth embodiment are different in the shapes of the second wirings and the insulating film.

Like the light-emitting device 6000, in a back view, second wirings 13 of the light-emitting device 7000 are located between two edge depressed portions and includes the exposed portion 131 exposed from the insulating film 18. The exposed portion 131 on the back surface is surrounded by the insulating film 18 except for the bottom surface 113 side. Disposing a bonding member on the exposed portion 131 can improve the bonding strength between the light-emitting device 7000 and the mounting board.

Figure 25A:
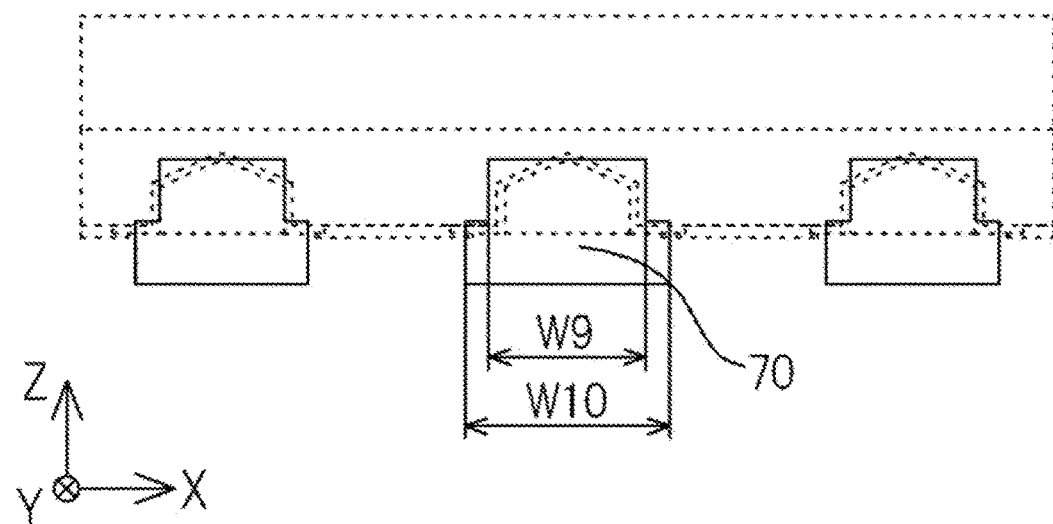
FIG. 25A is a schematic bottom view of lands indicated by continuous lines and the light-emitting device according to the first embodiment indicated by dotted lines.
Figure 25B:
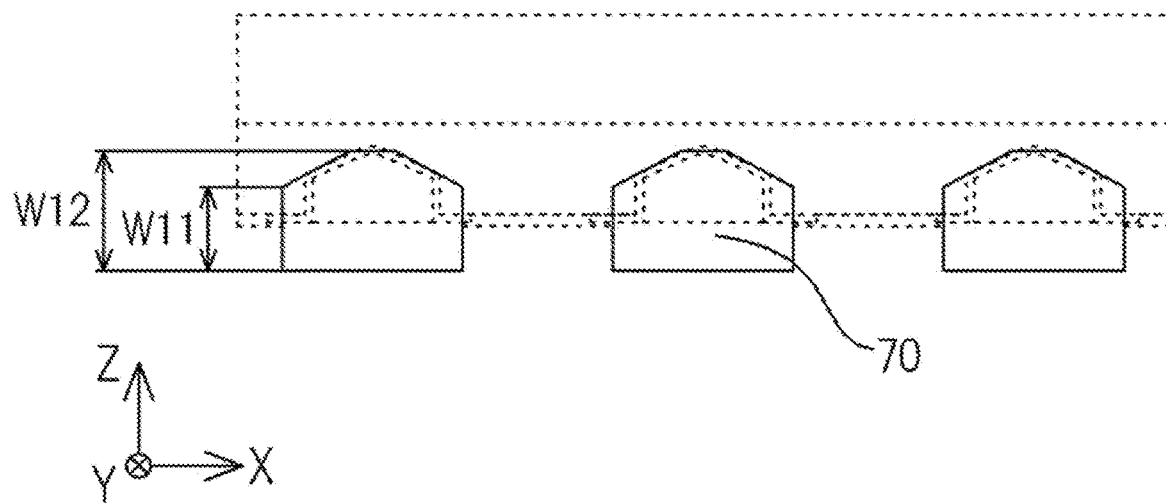
FIG. 25B is a schematic bottom view of a modification of lands indicated by continuous lines and the light-emitting device according to the first embodiment indicated by dotted lines.
Figure 25C:
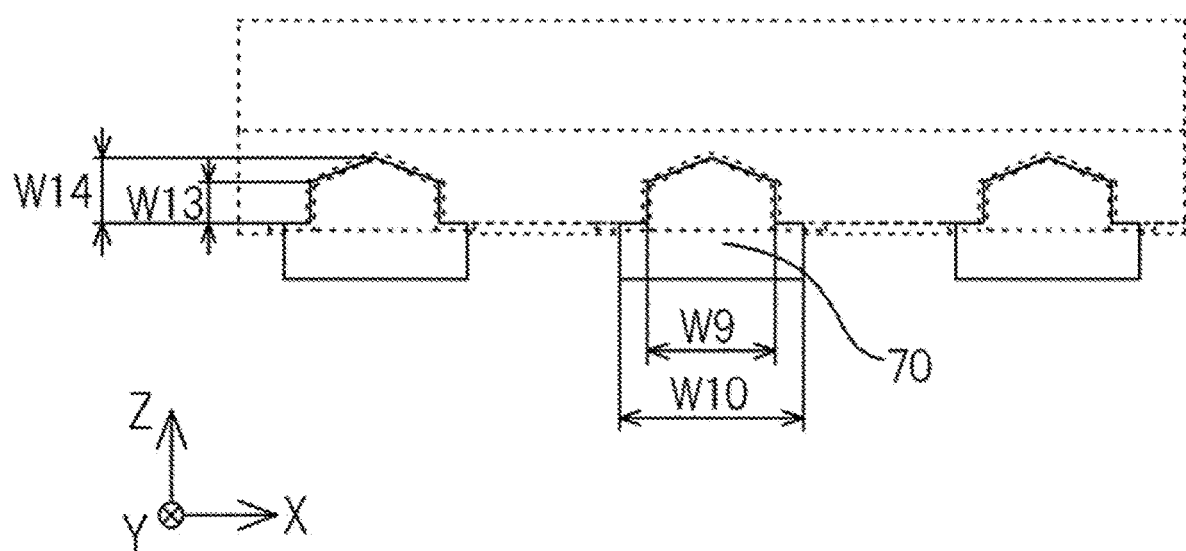
FIG. 25C is a schematic bottom view of a modification of lands indicated by continuous lines and the light-emitting device according to the first embodiment indicated by dotted lines.

The shape of lands 70 on the mounting board on which the light-emitting device is to be mounted is not particularly limited, and the shape may be a substantial quadrilateral or a substantial circle. For example, each land 70 on the mounting board on which the light-emitting device according to the first embodiment is to be mounted may include a wide portion W10 widened in the X direction and a narrow portion W9 narrowed in the X direction as shown in FIG. 25A. Positioning the narrow portion W9 so as to overlap the depressed portion in a bottom view facilitates self-alignment when the light-emitting device is mounted on or above the mounting board. Also, including the wide portion W10 in the land 70 can increase the area of the land 70 in a bottom view. This structure can alleviate unevenness in the thickness of the bonding members. For example, the depressed portion of the light-emitting device according to the first embodiment has the greatest depth at the center in the Z direction. When such the light-emitting device is mounted on the mounting board, the mounting board preferably include a land in which a length W12 at the center in the Z direction is larger than a length W11 at an end in the Z direction as shown in FIG. 25B. This structure can facilitate self-alignment when the light-emitting device is mounted on or above the mounting board. Also, the land 70 including the wide portion W10 and the narrow portion W9 may have a length W14 at the center of the narrow portion of the land 70 in the Z direction larger than a length W13 at an end of the narrow portion of the land 70 in the Z direction as shown in FIG. 25C. This structure can facilitate self-alignment when the light-emitting device according to the first embodiment is mounted on or above the mounting board, and can alleviate unevenness in the thickness of the bonding members.

Figure 26A:
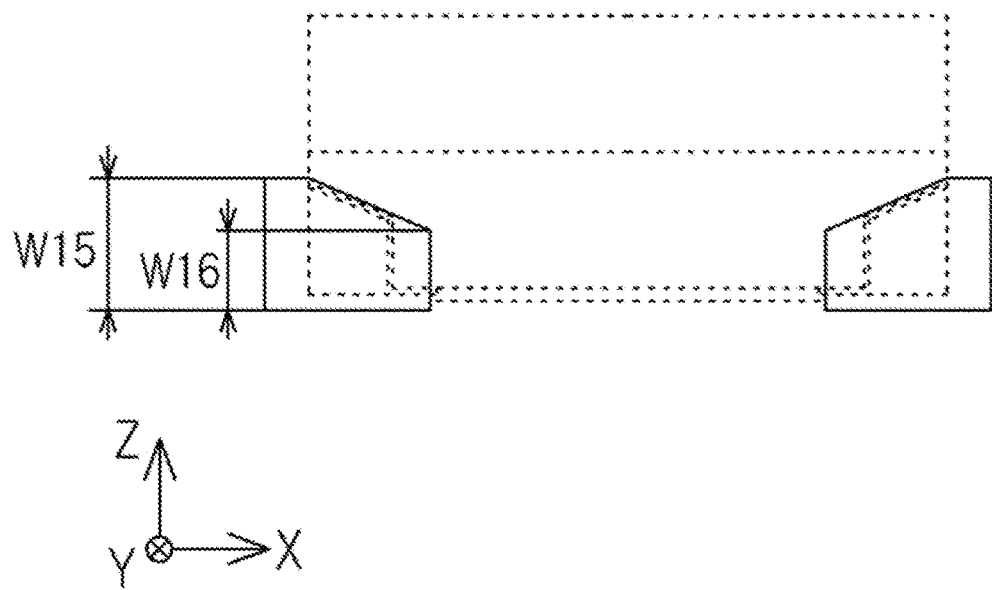
FIG. 26A is a schematic bottom view of lands indicated by continuous lines and the light-emitting device according to the fourth embodiment indicated by dotted lines.
Figure 26B:
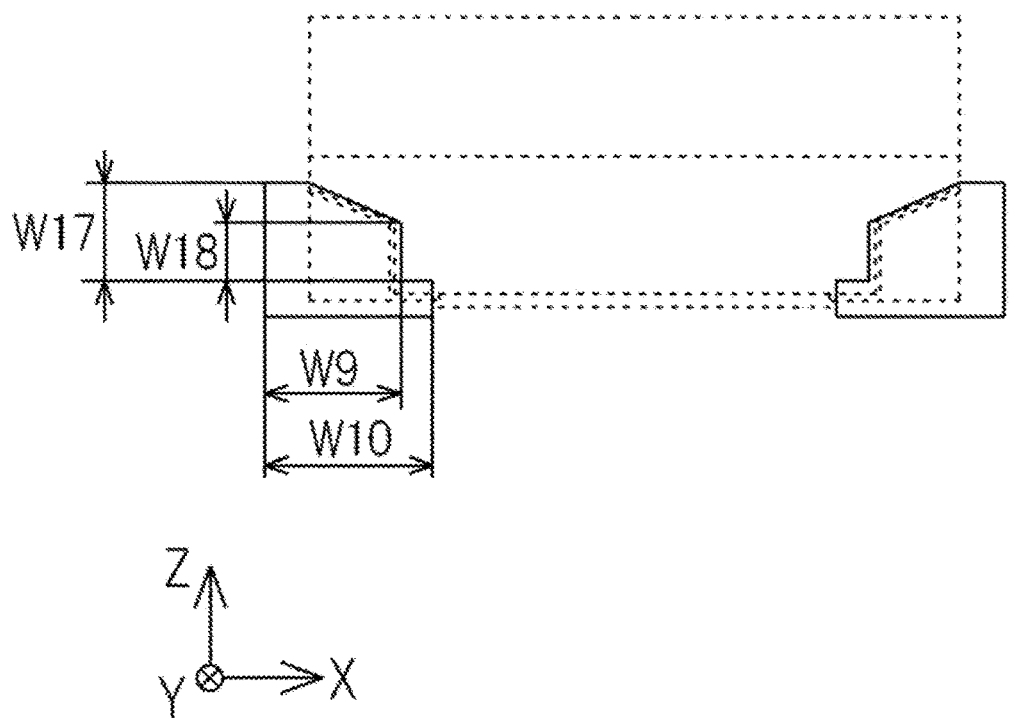
FIG. 26B is a schematic bottom view of a modification of lands indicated by continuous lines and the light-emitting device according to the fourth embodiment indicated by dotted lines.
Figure 27:
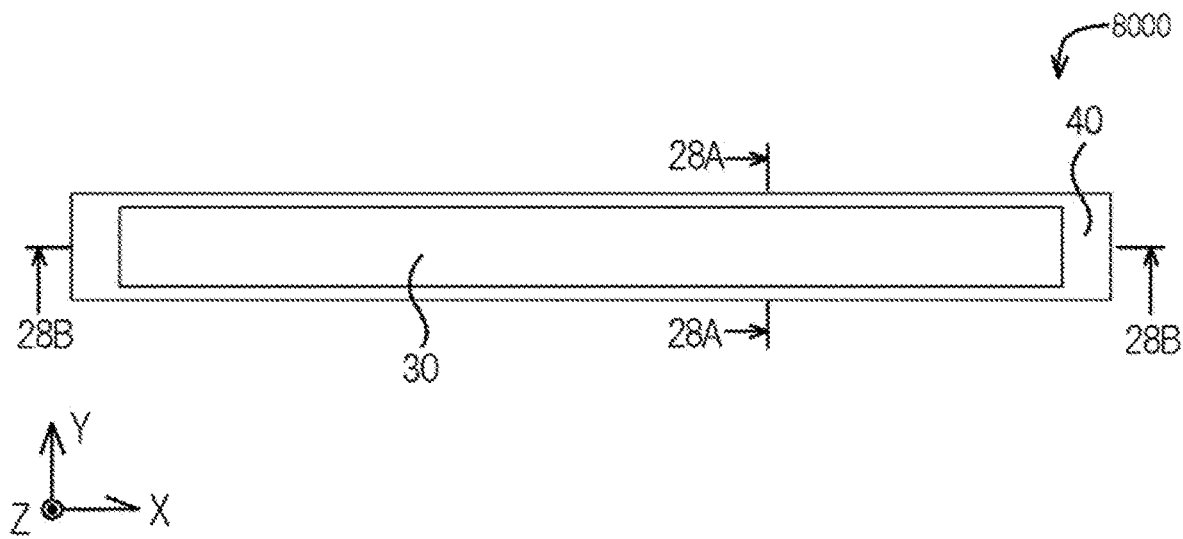
FIG. 27 is a schematic front view of a light-emitting device according to an eighth embodiment.

For example, the depressed portion of the light-emitting device according to the fourth embodiment has the depth becoming larger in the Z direction as the distance from the center of the light-emitting device increases. When such the light-emitting device is mounted on the mounting board, as shown in FIG. 26A, the mounting board preferably include a land in which a length W15 in the Z direction on the side far from the center in X direction of the light-emitting device is larger than a length W16 in the Z direction on the side near the center of the light-emitting device. This structure can facilitate self-alignment when the light-emitting device is mounted on or above the mounting board. Also, as shown in FIG. 26B, the land 70 including the wide portion W10 widened in the X direction and the narrow portion W9 narrowed in the X direction. The land 70 preferably has lengths W17 and W18 of the narrow portion of the land 70 in the Z direction. The length W18 denotes the side at the end far from the center of the light-emitting device. The length W18 denotes the side at the end near the center of the light-emitting device. The length W17 is longer then the length W18. Positioning the narrow portion so as to overlap the edge depressed portion in a bottom view can facilitate self-alignment when the light-emitting device is mounted on or above the mounting board. Also, the land 70 includes the wide portion, thereby increasing the area of the land 70 in a bottom view. This structure can alleviate unevenness in the thickness of the bonding members. Making the length W17 larger than the length W18 can facilitate self-alignment when the light-emitting device is mounted on or above the mounting board.

Eighth Embodiment

A light-emitting device 8000 according to an eighth embodiment of the present disclosure shown in FIG. 27 to FIG. 30 and the light-emitting device 1000 according to the first embodiment are different in the number of light-emitting elements mounted on the substrate, the numbers of depressed portions and via holes of the base member, and the shape of the light-transmissive member. The shape of the depressed portions 16 is the same as the shape in the first embodiment.

Figure 28A:
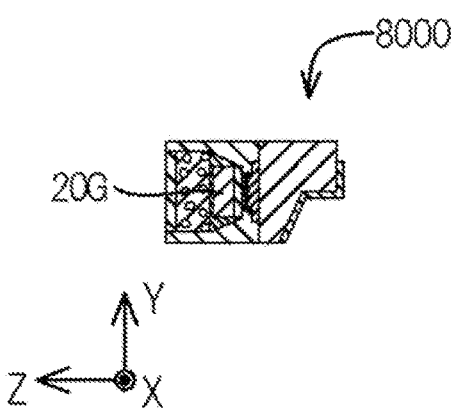
FIG. 28A is a schematic sectional view taken along the line 28A-28A in FIG. 27.

As shown in FIG. 28A, the depressed portions from the back surface toward the front surface of the light-emitting device 8000 each have a depth greater on the bottom surface side than on the upper surface side as in the first embodiment. Hence, the thickness of the base member on the upper surface side of the depressed portions can be greater than the thickness of the base member on the bottom surface side of the depressed portions. This structure can alleviate decrease in the strength of the base member. Also, making the depressed portions deeper on the bottom surface side can increase volumes of the bonding members formed inside the depressed portions, thereby improving the bonding strength between the light-emitting device 8000 and the mounting board.

Figure 28B:
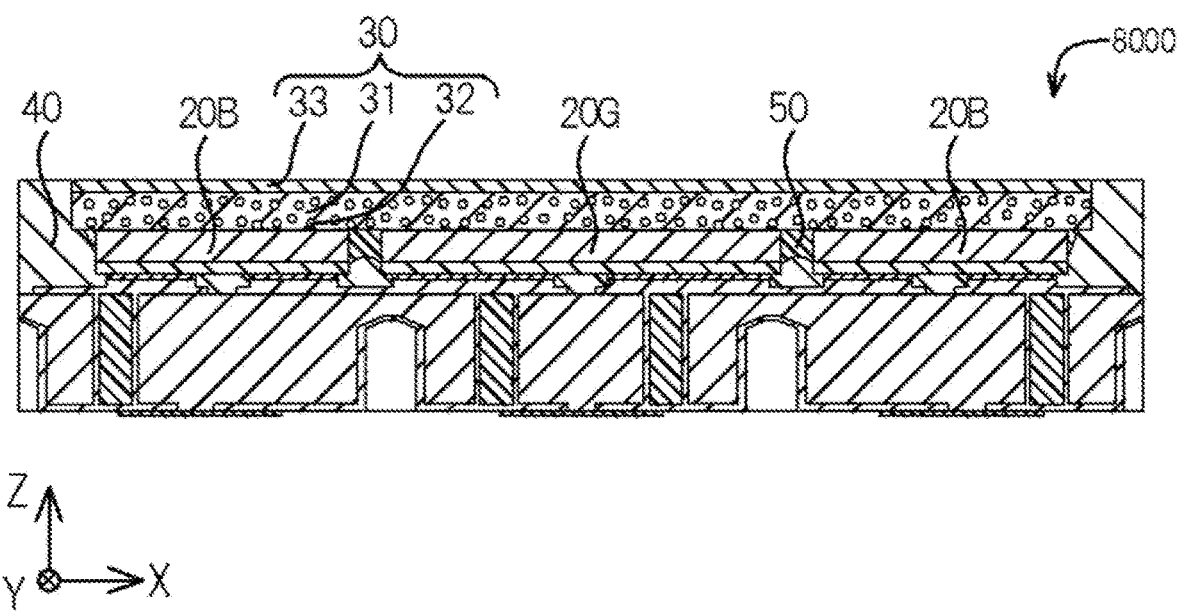
FIG. 28B is a schematic sectional view taken along the line 28B-28B in FIG. 27.
Figure 29:
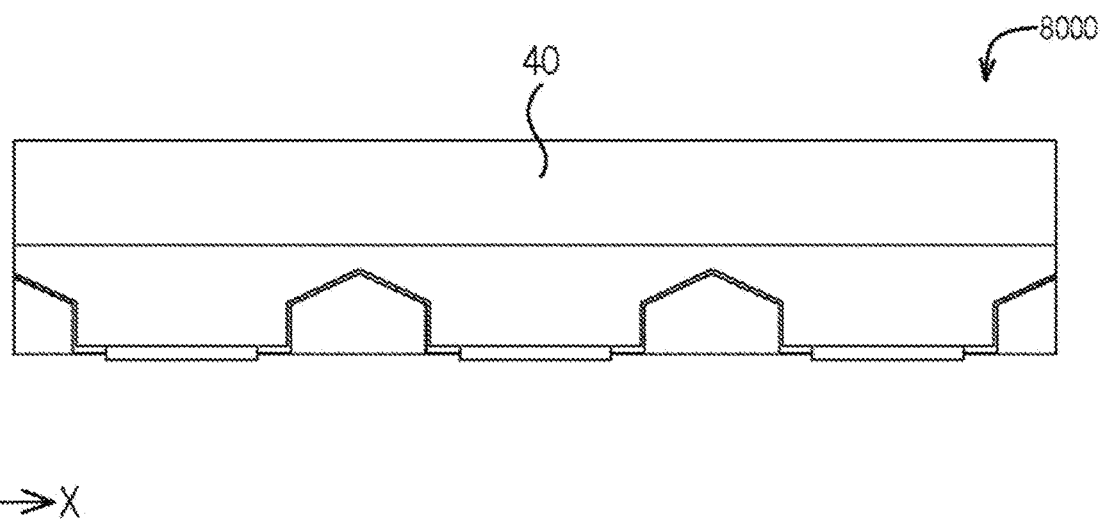
FIG. 29 is a schematic bottom view of the light-emitting device according to the eighth embodiment.

The number of the light-emitting elements may be three as shown in FIG. 28B. The peak wavelengths of the three light-emitting elements may be the same as or different to one another. It is also possible that the peak wavelengths of two light-emitting elements are the same and the peak wavelength of the other one light-emitting element differs from the peak wavelengths of the two light-emitting elements. The statement that "the peak wavelengths of light-emitting elements are the same" in the present specification means that a tolerance of about 5 nm is acceptable. In the case where the peak wavelengths of the light-emitting elements are different, the light-emitting elements preferably include first light-emitting elements 20B having an emission peak wavelength in the range of from 430 nm to less than 490 nm (i.e., wavelength range in the blue region) and a second light-emitting element 20G having an emission peak wavelength in the range of from 490 nm to 570 nm (i.e., wavelength range in the green region) as shown in FIG. 28B. In particular, a light-emitting element having a half-width of 40 nm or less is preferably used as the second light-emitting element 20G, and a light-emitting element having a half-width of 30 nm or less is more preferably used. Using such a light-emitting device can achieve green light having a sharp peak more easily than in the case where green light is obtained using a green phosphor. Accordingly, a liquid-crystal display including the light-emitting device 8000 can achieve high color reproducibility.

The arrangement of the first light-emitting elements 20B and the second light-emitting element 20G is not particularly limited. Preferably, one of the first light-emitting elements 20B that is a blue light-emitting element, the second light-emitting element 20G that is a green light-emitting element, and the other first light-emitting element 20B that is a blue light-emitting element, are aligned in order from the left side as shown in FIG. 28B. Alternately disposing the first light-emitting elements 20B and the second light-emitting element 20G in a line improves color mixing properties of the light-emitting device. A second light-emitting element, a first light-emitting element, and a second light-emitting element may be aligned in order from the left side. Depending on the desired light emission characteristics, the number of the first light-emitting elements 20B may be larger than the number of the second light-emitting elements 20G, the number of the second light-emitting elements 20G may be larger than the number of the first light-emitting elements 20B, or the number of the first light-emitting elements 20B may be the same as the number of the second light-emitting elements 20G. A light-emitting device having an desired color and light quantity can be provided by adjusting the number of light-emitting elements.

In the case where one light-transmissive member 30 is provided on the plurality of first light-emitting elements 20B and the second light-emitting element 20G as shown in FIG. 28B, it is preferable that the wavelength conversion substance 32 hardly absorb green light from the second light-emitting element 20G and emit red light. That is, it is preferable that the wavelength conversion substance 32 does not substantially convert green light into red light. The reflectance of the wavelength conversion substance 32 with respect to green light is preferably 70% or more on average in the wavelength range of green light. Designing the light-emitting device is facilitated by employing a phosphor having a high reflectance with respect to green light, that is, less likely to absorb green light, that is, less likely to convert the wavelength of green light, as the wavelength conversion substance 32.

In the case where a red phosphor readily absorbs green light is used, the output balance of the light-emitting device is required to be determined in consideration of wavelength conversion by the wavelength conversion substance 32 not only for the first light-emitting elements 20B but also for the second light-emitting element 20G. On the other hand, in the case where the wavelength conversion substance 32 that hardly converts the wavelength of green light is used, the output balance of the light-emitting device can be designed in consideration of only wavelength conversion of blue light emitted from the first light-emitting elements 20B.

Examples of the wavelength conversion substance 32 having such preferable properties include red phosphors below. The wavelength conversion substance 32 is at least one of the followings.

A first type is red phosphors having compositions represented by the following general formula (I).

$$A_2MF_6:Mn^{4+} \qquad (I)$$

In the above general formula (I), A is at least one selected from the group consisting of K, Li, Na, Rb, Cs, and $NH^{4+}$, and M is at least one element selected from the group consisting of the group IV elements and the group XIV elements.

The group IV elements include titanium (Ti), zirconium (Zr), and hafnium (Hf). The group XIV elements include silicon (Si), germanium (Ge), tin (Sn), and lead (Pb).

Specific examples of the first-type red phosphors include $K_2SiF_6:Mn^{4+}$, $K_2(Si,Ge)F_6:Mn^{4+}$, and $K_2TiF_6:Mn^{4+}$.

A second type is red phosphors having compositions represented by $3.5MgO \cdot 0.5MgF_2 \cdot GeO_2:Mn^{4+}$ or red phosphors having compositions represented by the following general formula (II).

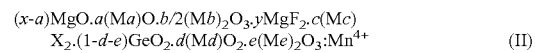

$$(x-a)MgO \cdot a(Ma)O \cdot b/2(Mb)_2O_3 \cdot yMgF_2 \cdot c(Mc)$$
$$X_2 \cdot (1-d-e)GeO_2 \cdot d(Md)O_2 \cdot e(Me)_2O_3:Mn^{4+} \qquad (II)$$

In the above general formula (II): Ma is at least one selected from Ca, Sr, Ba, and Zn; Mb is at least one selected from Sc, La, and Lu; Mc is at least one selected from Ca, Sr, Ba, and Zn; X is at least one selected from F and Cl; Md is at least one selected from Ti, Sn, and Zr; and Me is at least one selected from B, Al, Ga, and In. Also, x, y, a, b, c, d, and e satisfy $2 \leq x \leq 4$, $0 < y \leq 2$, $0 \leq a \leq 1.5$, $0 \leq b < 1$, $0 \leq c \leq 2$, $0 \leq d \leq 0.5$, and $0 \leq e < 1$.

Figure 30:
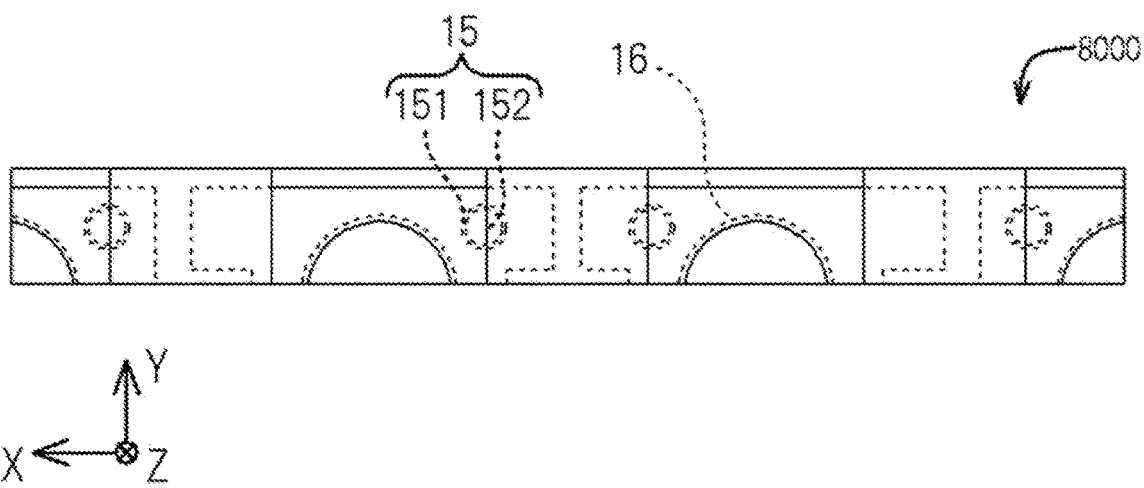
FIG. 30 is a schematic back view of the light-emitting device according to the eighth embodiment.

The light-emitting device 8000 includes three light-emitting elements, therefore, its length in the first direction (i.e., X direction) tends to be larger than in the case where one light-emitting element is included. Hence, the numbers of the depressed portions and the via holes may be changed as appropriate. For example, four depressed portions 16 and four via holes may be formed as shown in FIG. 30.

Figure 31:
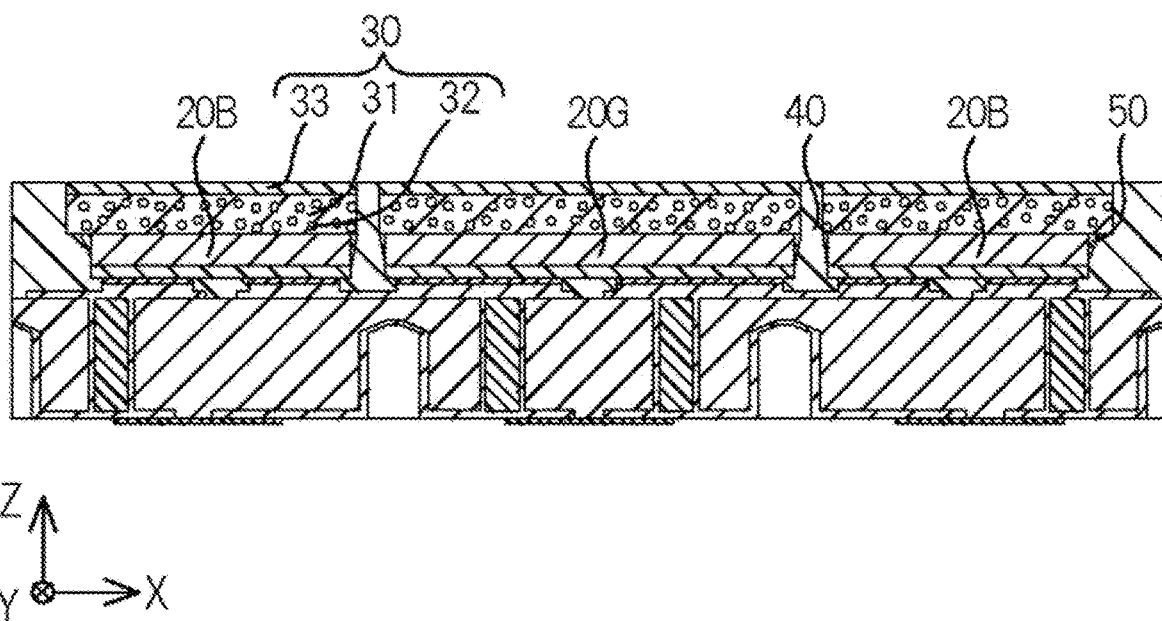
FIG. 31 is a schematic sectional view of a modification of the light-emitting device according to the eighth embodiment.

One light-transmissive member 30 may be disposed on each of the first light-emitting elements and the second light-emitting element as shown in FIG. 31, or one light-transmissive member 30 may be disposed on a plurality of light-emitting elements as shown in FIG. 28B. In the case where one light-transmissive member 30 is located on each of the first light-emitting elements and the second light-emitting element as shown in FIG. 31, the wavelength conversion substance 32 contained in the light-transmissive members 30 disposed on the first light-emitting elements 20B may be the same as or different to the wavelength conversion substance 32 the light-transmissive member 30 on the second light-emitting element 20G. For example, in the case where the wavelength conversion substance 32 hardly absorbs green light from the second light-emitting element 20G and hardly emit red light, the light-transmissive members 30 on the first light-emitting elements 20B may contain a red phosphor as the wavelength conversion substance 32, and the light-transmissive member 30 on the second light-emitting element 20G may not contain a red phosphor as the wavelength conversion substance 32. With this structure, the output balance of the light-emitting device can be designed in consideration of only wavelength conversion of blue light emitted from the first light-emitting elements 20B. In the case where one light-transmissive member 30 is located on each of the first light-emitting elements and the second light-emitting element, the covering member is formed between respective of the light-transmissive members 30 on the first light-emitting elements 20B and the light-transmissive member 30 on the second light-emitting element 20G. In the case where one light-transmissive member 30 is disposed on a plurality of light-emitting elements as shown in FIG. 28B, the area of the light-transmissive member 30 in a front view can be increased, thereby improving the light extraction efficiency of the light-emitting device. Also, having only one light emitting surface in the light-emitting device can reduce the luminance non-uniformity of the light-emitting device.

In the case where one light-transmissive member 30 is disposed on a plurality of light-emitting elements, the light-guiding members 50 bonding the light-emitting elements 20 to the light-transmissive member 30 may be connected to or separated from each other in the regions between respective of the first and second light-emitting elements 20B and 20G. The light-guiding member 50 preferably fills the gap between one light-emitting element and another light-emitting element as shown in FIG. 28B. This structure enables the light-guiding member to guide light emitted from the light-emitting elements in a gap between one light-emitting element and another light-emitting element to the light-transmissive member, and thus reduces the luminance non-uniformity of the light-emitting device.

The light-transmissive member 30 may include a layer containing the wavelength conversion substance 32 and a layer 33 containing substantially no wavelength conversion substance as shown in FIG. 28B and FIG. 31. If the light-transmissive member 30 includes the layer 33 containing substantially no wavelength conversion substance on the layer containing the wavelength conversion substance 32, the layer 33 containing substantially no wavelength conversion substance also functions as a protective layer, and thus can alleviate deterioration of the wavelength conversion substance 32. In the case where one light-transmissive member 30 is located on each of the first light-emitting elements and the second light-emitting element as shown in FIG. 31, the thicknesses of the layers 33 containing substantially no wavelength conversion substance located on the first light-emitting elements 20B and the layer 33 containing substantially no wavelength conversion substance located on the second light-emitting element 20G may be the same or different. Also, in the case where one light-transmissive member 30 is located on each of the first light-emitting elements and the second light-emitting element, the thicknesses of the layers containing the wavelength conversion substance 32 located on the first light-emitting elements 20B and the layer containing the wavelength conversion substance 32 located on the second light-emitting element 20G may be the same or different. The statement that "the thicknesses are the same" in the present specification means that a tolerance of about 5 μm is acceptable.

The following describes the components of a light-emitting device according to one embodiment of the present disclosure.

Substrate 10

The substrate 10 is a member on which the light-emitting element is mounted. The substrate 10 includes at least the base member 11, the first wirings 12, the second wirings 13, the third wirings 14, and the via holes 15.

Base Member 11

The base member 11 can include an insulating member such as resins or fiber-reinforced resins, ceramics, and glass. Examples of the resins or fiber-reinforced resins include epoxy resins, glass epoxy resins, bismaleimide-triazine (BT) resins, and polyimides. Examples of the ceramics include aluminum oxide, aluminum nitride, zirconium oxide, zirconium nitride, titanium oxide, titanium nitride, and mixtures thereof. Among these base members, a base member having the coefficient of linear expansion close to that of the light-emitting element is particularly preferably used. The lower limit of the thickness of the base member can be appropriately selected. The lower limit is preferably 0.05 mm or more, more preferably 0.2 mm or more, in view of the strength of the base member. The upper limit of the thickness of the base member is preferably 0.5 mm or less, more preferably 0.4 mm or less, in view of the thickness/depth of the light-emitting device.

First Wirings 12, Second Wirings 13, and Third Wirings 14

The first wirings are disposed on the front surface of the substrate and electrically connected to the light-emitting element. The second wirings are disposed on the back surface of the substrate and electrically connected to the first wirings through the via holes. The third wirings cover the inner walls of the depressed portions and are electrically connected to the second wirings. The first wirings, second wirings, and third wirings can be formed of copper, iron, nickel, tungsten, chromium, aluminum, silver, gold, titanium, palladium, rhodium, or an alloy of these metals. A single layer or multiple layers mainly containing these metals or alloys of these metals may be used. In particular, copper or a copper alloy is preferable in view of heat dissipation. Surface layers of the first wirings and/or the second wirings may mainly contain materials such as silver, platinum, aluminum, rhodium, gold, and alloys of these metals in view of wettability and/or light reflectivity and the like of the electrically-conductive adhesive members.

Via Holes 15

The via holes 15 are formed inside the holes penetrating through the base member 11 from the front surface to the back surface and are members that electrically connect the first wirings and the second wirings. The via holes 15 each include the fourth wiring 151 covering the surface of the through-hole in the base member and the filler member 152 filled into the fourth wiring 151. The fourth wiring 151 can be formed of such an electrically-conductive member as used for the first wirings, the second wirings, and the third wirings. The filler member 152 can be formed of an electrically-conductive member or an insulating member.

Insulating Film 18

The insulating film 18 is a member intended to ensure insulation and prevent short circuits on the back surface. The insulating film may be formed of a material used in the field of the disclosure. Examples of the material include thermosetting resins and thermoplastic resins.

Light-Emitting Element 20

The light-emitting element 20 is a semiconductor element that emits light by itself when voltage is applied, and a known semiconductor element made of a nitride semiconductor or the like can be used. Examples of the light-emitting element 20 include LED chips. The light-emitting element 20 includes at least the semiconductor layered body 23 and, in many cases, the element substrate 24. The shape in a top view of the light-emitting element is preferably a rectangle, in particular a square or a rectangle elongated in one direction, but other shapes may be employed. For example, a hexagon can increase the light-emission efficiency. The lateral surfaces of the light-emitting element may be perpendicular to the upper surface, or may be inclined inward or outward. The light-emitting element includes positive and negative electrodes. The positive and negative electrodes can be formed of a material mainly containing gold, silver, tin, platinum, rhodium, titanium, aluminum, tungsten, palladium, nickel, or an alloy thereof. The emission peak wavelength of the light-emitting element can be selected from the ultraviolet range to the infrared range by changing the semiconductor materials or their mixing ratios of the crystals. A nitride semiconductor, which can emit short-wavelength light capable of efficiently exciting the wavelength conversion substance, is preferably used as the semiconductor material. The nitride semiconductor is typically represented by the general formula $In_xAl_yGa_{1-x-y}N$ ($0 \leq x$, $0 \leq y$, $x+y \leq 1$). The emission peak wavelength of the light-emitting element is preferably in the range of 400 nm to 530 nm, more preferably 420 nm to 490 nm, and even more preferably 450 nm to 475 nm in view of light-emission efficiency, excitation of the wavelength conversion substance, color mixing relations with light emission of the wavelength conversion substance, and such other conditions. In addition, InAlGaAs semiconductors, InAlGaP semiconductors, zinc sulfide, zinc selenide, silicon carbide, and the like can also be used. The element substrate of the light-emitting element is typically a crystal growth substrate on which a semiconductor crystal constituting the semiconductor layered body can be grown, but a support substrate may be employed to be bonded to the semiconductor element structure that is separated from the crystal growth substrate. A light-transmissive element substrate can facilitate employment of flip-chip mounting and enhancement of light extraction efficiency. Examples of the matrix of the element substrate include sapphire, gallium nitride, aluminum nitride, silicon, silicon carbide, gallium arsenide, gallium phosphide, indium phosphide, zinc sulfide, zinc oxide, zinc selenide, and diamond. Among these materials, sapphire is preferable. The thickness of the element substrate can be appropriately selected and is, for example, in the range of 0.02 to 1 mm, preferably 0.05 to 0.3 mm in view of the mechanical strength of the element substrate and/or the thickness of the light-emitting device.

Light-Transmissive Member 30

The light-transmissive member is disposed on the light-emitting element and protects the light-emitting element. The light-transmissive member includes at least the matrix below. The light-transmissive member can function as a wavelength conversion member by mixing the wavelength conversion substance 32 in the matrix. The matrix of each layer has a constitution described below also in the case where the light-transmissive member includes the layer containing the wavelength conversion substance and the layer containing substantially no wavelength conversion substance. The matrices of the layers may be the same or different. It is not necessary that the light-transmissive member contain the wavelength conversion substance. The light-transmissive member can employ a sintered body of the wavelength conversion substance and an inorganic material such as alumina, a plate-shaped crystal of the wavelength conversion substance, or the like.

Matrix 31 of Light-Transmissive Member

The matrix 31 of the light-transmissive member is not limited as long as the matrix is light-transmissive with respect to light emitted from the light-emitting element. The term "light-transmissive" means that the light transmittance at the emission peak wavelength of the light-emitting element is preferably 60% or more, more preferably 70% or more, even more preferably 80% or more. The matrix of the light-transmissive member can employ a silicone resin, an epoxy resin, a phenolic resin, a polycarbonate resin, an acrylic resin, a modified resin thereof, or glass. Among these materials, silicone resins and modified silicone resins are preferable due to their good heat and light resistance. Specific examples of the silicone resins include dimethyl silicone resins, phenyl-methyl silicone resins, and diphenyl silicone resins. The light-transmissive member can include one of these matrix materials, or include two or more of these matrix materials layered on each other. The "modified resins" in the present specification include hybrid resins.

Various fillers may be mixed in any of the above resins or glass for the matrix of the light-transmissive member. Examples of the fillers include silicon oxide, aluminum oxide, zirconium oxide, and zinc oxide. These fillers can be used singly, or two or more of the fillers can be used in combination. Silicon oxide is particularly preferable due to the fact that silicon oxide have a small coefficient of thermal expansion. Using nanoparticles as the filler can increase scattering of light emitted from the light-emitting element and reduces the quantity of the wavelength conversion substance to be used. The nanoparticles are particles having diameters in the range of 1 nm to 100 nm. The "particle diameter" in the present specification is defined as, for example, $D_{50}$.

Wavelength Conversion Substance 32

The wavelength conversion substance absorbs at least part of the primary light emitted from the light-emitting element and emits the secondary light that differs in wavelengths from the primary light. Specific examples of the wavelength conversion substance can be used singly, or two or more of the substances may be used in combination as described below.

Examples of wavelength conversion substances that emit green light include yttrium-aluminum-garnet phosphors (for example, $Y_3(Al,Ga)_5O_{12}:Ce$), lutetium-aluminum-garnet phosphors (for example, $Lu_3(Al,Ga)_5O_{12}:Ce$), terbium-aluminum-garnet phosphors (for example, $Tb_3(Al,Ga)_5O_{12}:Ce$) phosphors, silicate phosphors (for example, $(Ba,Sr)_2SiO_4:Eu$), chlorosilicate phosphors (for example, $Ca_8Mg(SiO_4)_4Cl_2:Eu$), β-SiAlON phosphors (for example, $Si_{6-z}Al_zO_zN_{8-z}:Eu$ ($0<z<4.2$)), and SGS phosphors (for example, $SrGa_2S_4:Eu$). Examples of wavelength conversion substances that emit yellow light include α-SiAlON phosphors (for example, $M_z(Si,Al)_{12}(O,N)_{16}$ (where $0<z\leq2$, and M is Li, Mg, Ca, Y, or a lanthanoid element other than La or CO). Some of the above wavelength conversion substances that emit green light emit yellow light. Also, for example, yellow light can be obtained by substituting part of Y (i.e., yttrium) in an yttrium-aluminum-garnet phosphor with Gd (i.e., gadolinium) to shift its emission peak wavelength to a longer wavelength. Such wavelength conversion substances also include wavelength conversion substances that can emit orange light. Examples of wavelength conversion substances that emit red light include nitrogen-containing calcium aluminosilicate (CASN or SCASN) phosphors (for example, $(Sr,Ca)AlSiN_3:Eu$). The examples also include manganese-activated fluoride phosphors (phosphors represented by the general formula (I) $A_2[M_{1-a}Mn_aF_6]$ (in the general formula (I), A is at least one selected from the group consisting of K, Li, Na, Rb, Cs, and $NH_4$, M is at least one element selected from the group consisting of the group IV elements and the group XIV elements, and a satisfies $0<a<0.2$)). Typical examples of the manganese-activated fluoride phosphors include manganese-activated potassium fluorosilicate phosphors (for example, $K_2SiF_6:Mn$).

Covering Member 40

The light reflectance of the covering member having light reflectivity at the emission peak wavelength of the light-emitting element is preferably 70% or more, more preferably 80% or more, even more preferably 90% or more, in view of upward light extraction efficiency. In addition, the covering member is preferably white. Thus, the covering member preferably contains a white pigment in the matrix. The covering member is in a liquid state before being hardened. The covering member can be formed by transfer molding, injection molding, compression molding, potting, or the like.

Matrix of Covering Member

The matrix of the covering member can be a resin such as silicone resins, epoxy resins, phenolic resins, polycarbonate resins, acrylic resins, and modified resins thereof. Among these materials, silicone resins and modified silicone resins are preferable due to their good heat and light resistance. Specific examples of the silicone resins include dimethyl silicone resins, phenyl-methyl silicone resins, and diphenyl silicone resins. The matrix of the covering member may contain a filler similar to the foregoing filler in the light-transmissive member.

White Pigment

As the white pigment, one of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide can be used singly, or two or more of these pigments can be used in combination. The shape of the white pigment particles can be appropriately selected, and may be irregular or crushed, but is preferably spherical in view of fluidity. The particle diameter of the white pigment is, for example, in the range of about 0.1 µm to 0.5 µm. The particles preferably have smaller diameters to enhance effects of light reflection and covering. The content of the white pigment in the covering member having light reflectivity can be appropriately selected. In view of light reflectivity, the viscosity in a fluid state, and the like, the content is preferably in the range of, for example, 10 wt % to 80 wt %, more preferably 20 wt % to 70 wt %, even more preferably 30 wt % to 60 wt %. The term "wt %" means percentage by weight, that is, the proportion of the weight of a material of interest to the total weight of the covering member.

Light-Guiding Member 50

The light-guiding member bonds the light-emitting element to the light-transmissive member and guides light from the light-emitting element to the light-transmissive member. Examples of the matrix of the light-guiding member include silicone resins, epoxy resins, phenolic resins, polycarbonate resins, acrylic resins, and modified resins thereof. Among these materials, silicone resins and modified silicone resins are preferable due to their good heat and light resistance and. Specific examples of the silicone resins include dimethyl silicone resins, phenyl-methyl silicone resins, and diphenyl silicone resins. The matrix of the light-guiding member may contain a filler similar to the foregoing filler in the light-transmissive member. The light-guiding member may be omitted.

Electrically-Conductive Adhesive Members 60

The electrically-conductive adhesive members electrically connect the electrodes of the light-emitting element and the first wirings. The electrically-conductive adhesive members can employ any one of: bumps mainly containing gold, silver, copper, or the like; a metal paste containing a resin binder and powder of a metal such as silver, gold, copper, platinum, aluminum, and palladium; a tin-bismuth, tin-copper, tin-silver, or gold-tin solder or the like; and a brazing filler metal such as a low-melting-point metal.

A light-emitting device according to an embodiment of the present disclosure can be used for backlight devices for liquid-crystal displays, various lighting apparatuses, large displays, various displays for advertisements and destination guide, and projectors, as well as for image scanners for apparatuses such as digital video cameras, facsimile machines, copying machines, and scanners.

What is claimed is:

1. A light-emitting device comprising:
   a substrate comprising:
   a base member including:
   a front surface extending in a first direction and a second direction, the first direction being a longitudinal direction and the second direction being a width direction of the base member;
   a back surface opposite to the front surface; and
   a bottom surface and an upper surface adjacent and perpendicular to the front surface while being opposed to each other;
   a first wiring disposed on the front surface;
   a second wiring disposed on the back surface; and
   a via hole electrically connecting the first wiring and the second wiring;
   at least one light-emitting element electrically connected to and disposed on the first wiring; and
   a covering member having light reflectivity and covering a lateral surface of the light-emitting element and a front surface of the base member, wherein
   the base member defines a plurality of depressed portions separated from the via hole in a front view and opening on the back surface and the bottom surface,
   the substrate includes a third wiring covering at least one of inner walls of the plurality of depressed portions and electrically connected to the second wiring,
   each of the plurality of depressed portions extends in the first direction, the second direction and a third direction, the third direction being a depth direction of the base member,
   a depth of each of the plurality of depressed portions in the third direction from the back surface toward the front surface positioned on a bottom surface side of the base member is larger than a depth of the each of the plurality of depressed portions in the third direction from the back surface toward the front surface positioned on an upper surface side of the base member.

2. The light-emitting device according to claim 1, wherein a depth of each of the plurality of depressed portions on the bottom surface reaches a maximum at a center of the depressed portion.

3. The light-emitting device according to claim 1, wherein each of the plurality of depressed portions has a semicircular shape on the back surface.

4. The light-emitting device according to claim 1, wherein a maximum depth of each of the plurality of depressed portions is 0.4 to 0.8 times a thickness of the base member.

5. The light-emitting device according to claim 1, wherein the plurality of depressed portions have a same shape as one another on the back surface.

6. The light-emitting device according to claim 1, wherein the plurality of depressed portions are bilaterally symmetric on the back surface with respect to a center line of the base member parallel to the second direction.

7. The light-emitting device according to claim 1, further comprising a light-transmissive member disposed on the light-emitting element.

8. The light-emitting device according to claim 7, wherein the covering member covers a lateral surface of the light-transmissive member.

9. The light-emitting device according to claim 1, wherein
the covering member has a lateral surface positioned between a upper surface side and a bottom surface side of the base member and positioned on both end sides of the base in the longitudinal direction, and
the lateral surface of the cover member is substantially flush with a lateral surface of the substrate in the width direction.

10. The light-emitting device according to claim 1, wherein the at least one light-emitting element comprises a plurality of light-emitting elements aligned in the first direction.

11. The light-emitting device according to claim 10 further comprising, a light-transmissive member, wherein the light-transmissive member is disposed on the plurality of light-emitting elements.

12. The light-emitting device according to claim 1, wherein the via hole comprises a fourth wiring and a filler member mainly containing a resin material.

13. The light-emitting device according to claim 1,
wherein the base member has a lateral surface positioned between the front surface and the back surface, and between the upper surface and the bottom surface, and
wherein at least one of the plurality of depressed portions has at least one edge depressed portion opening on the back surface, the bottom surface, and the lateral surface.

14. The light-emitting device according to claim 13, wherein the at least one edge depressed portion are formed on both ends of the base member in the longitudinal direction in a back view.

15. The light emitting device according to claim 1, wherein each of the depressed portions includes a parallel portion extending from the back surface in the third direction parallel to the bottom surface and an inclined portion inclined from the bottom surface of the base member toward the direction in which a thickness of the base member increases.

16. The light emitting device according to claim 1, wherein the covering member includes a pair of lateral surfaces that are along the first direction and located on a bottom surface side and a upper surface side, respectively, and the pair of lateral surfaces are inclined toward an inside of the light emitting device in the third direction.

17. A light-emitting device comprising:
a substrate comprising:
a base member including:
a front surface extending in a first direction and a second direction, the first direction being a longitudinal direction and the second direction being a width direction of the base member;
a back surface opposite to the front surface; and
a bottom surface and an upper surface adjacent and perpendicular to the front surface while being opposed to each other;
a first wiring disposed on the front surface;
a second wiring disposed on the back surface; and
a via hole electrically connecting the first wiring and the second wiring;
at least one light-emitting element electrically connected to and disposed on the first wiring; and
a covering member having light reflectivity and covering a lateral surface of the light-emitting element and a front surface of the base member, wherein
the base member defines a plurality of depressed portions separated from the via hole in a front view and opening on the back surface and the bottom surface,
the substrate includes a third wiring covering at least one of inner walls of the plurality of depressed portions and electrically connected to the second wiring,
each of the plurality of depressed portions extends in the first direction, the second direction and a third direction, the third direction being a depth direction of the base member,
a depth of each of the plurality of depressed portions in the third direction from the back surface toward the front surface positioned on a bottom surface side of the base member is larger than a depth of the each of the plurality of depressed portions in the third direction from the back surface toward the front surface positioned on an upper surface side of the base member,
each of the depressed portions includes a parallel portion extending from the back surface in the third direction parallel to the bottom surface and an inclined portion inclined from the bottom surface of the base member toward the direction in which a thickness of the base member increases, and
the covering member includes a pair of lateral surfaces that are along the first direction and located on a bottom surface side and a upper surface side, respectively, and the pair of lateral surfaces are inclined toward an inside of the light emitting device in the third direction.

* * * * *